United States Patent
More et al.

(10) Patent No.: US 11,316,046 B2
(45) Date of Patent: Apr. 26, 2022

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Shahaji B. More, Hsinchu (TW); Chun Hsiung Tsai, Xinpu Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/933,626

(22) Filed: Jul. 20, 2020

(65) Prior Publication Data

US 2021/0273099 A1 Sep. 2, 2021

Related U.S. Application Data

(60) Provisional application No. 62/982,716, filed on Feb. 27, 2020.

(51) Int. Cl.
*H01L 29/06* (2006.01)
*H01L 21/02* (2006.01)
(Continued)

(52) U.S. Cl.
CPC .... *H01L 29/7848* (2013.01); *H01L 21/02521* (2013.01); *H01L 21/02603* (2013.01);
(Continued)

(58) Field of Classification Search
CPC ......... H01L 21/02521; H01L 21/02603; H01L 21/823418; H01L 21/823468; H01L 21/823814; H01L 21/823864; H01L 29/0673; H01L 29/0669; H01L 29/24; H01L 29/267; H01L 29/42392; H01L 29/66439; H01L 29/66469; H01L 29/6653; H01L 29/66545; H01L 29/66553;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — David C Spalla
(74) *Attorney, Agent, or Firm* — McDermott Will & Emery LLP

(57) ABSTRACT

In a method of manufacturing a semiconductor device, an upper fin structure in which first semiconductor layers and second semiconductor layers are alternately stacked is formed over a lower fin structure, a sacrificial gate structure is formed over the upper fin structure, a source/drain region of the upper fin structure, which is not covered by the sacrificial gate structure, is etched thereby forming a source/drain space, the first semiconductor layers are laterally etched through the source/drain space, an inner spacer made of a dielectric material is formed on an end of each of the etched first semiconductor layers, and a source/drain epitaxial layer is formed in the source/drain space to cover the inner spacer. In etching the source/drain region, a part of the lower fin structure is also etched to form a recess, in which a (111) surface is exposed.

20 Claims, 23 Drawing Sheets

(51) Int. Cl.
    *H01L 29/66*     (2006.01)
    *H01L 29/08*     (2006.01)
    *H01L 29/165*     (2006.01)
    *H01L 29/78*     (2006.01)
    *H01L 27/088*     (2006.01)
    *H01L 21/8234*     (2006.01)
    *H01L 29/24*     (2006.01)
    *H01L 29/267*     (2006.01)
    *H01L 29/423*     (2006.01)
    *H01L 29/786*     (2006.01)

(52) U.S. Cl.
    CPC .......... *H01L 29/0673* (2013.01); *H01L 29/24* (2013.01); *H01L 29/267* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78618* (2013.01); *H01L 29/78696* (2013.01)

(58) Field of Classification Search
    CPC ........... H01L 29/6656; H01L 29/66636; H01L 29/66742; H01L 29/775; H01L 29/7848; H01L 29/78618; H01L 29/78696
    See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2015/0295084 A1 | 10/2015 | Obradovic et al. |
| 2019/0296145 A1* | 9/2019 | Huang ................ H01L 29/1054 |
| 2020/0020774 A1* | 1/2020 | Lee ........................ B82Y 10/00 |
| 2020/0220018 A1* | 7/2020 | Jang .................. H01L 29/78696 |
| 2020/0365692 A1* | 11/2020 | Jung ..................... H01L 29/785 |

* cited by examiner

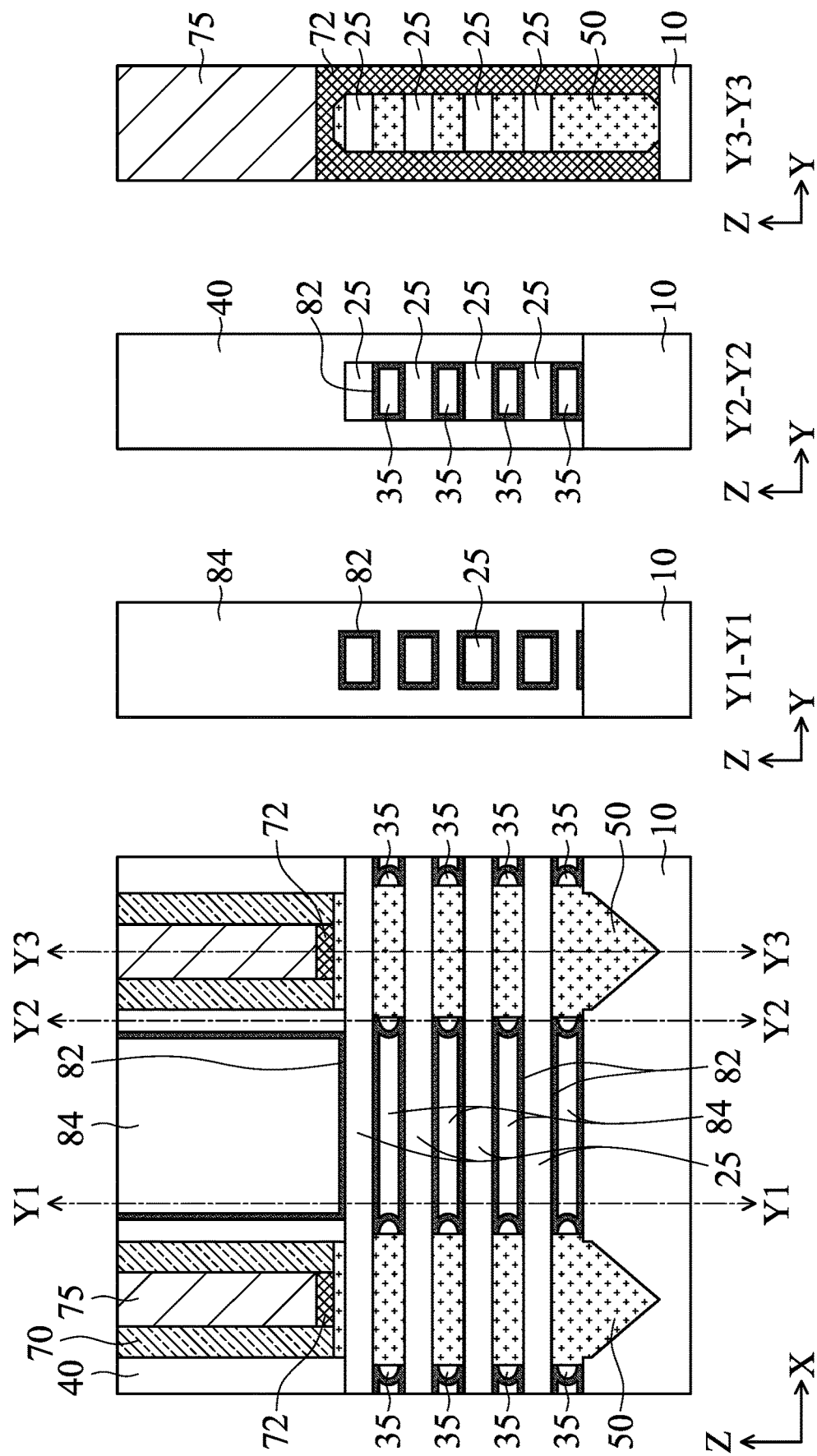

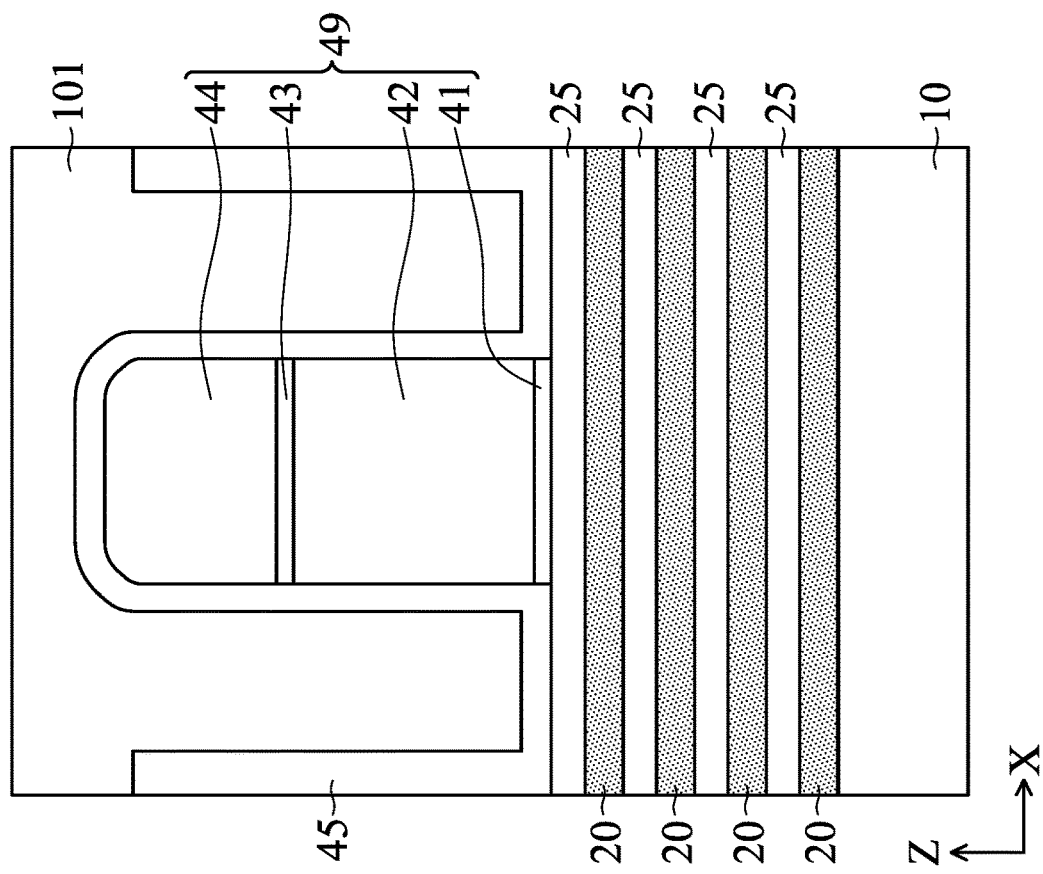
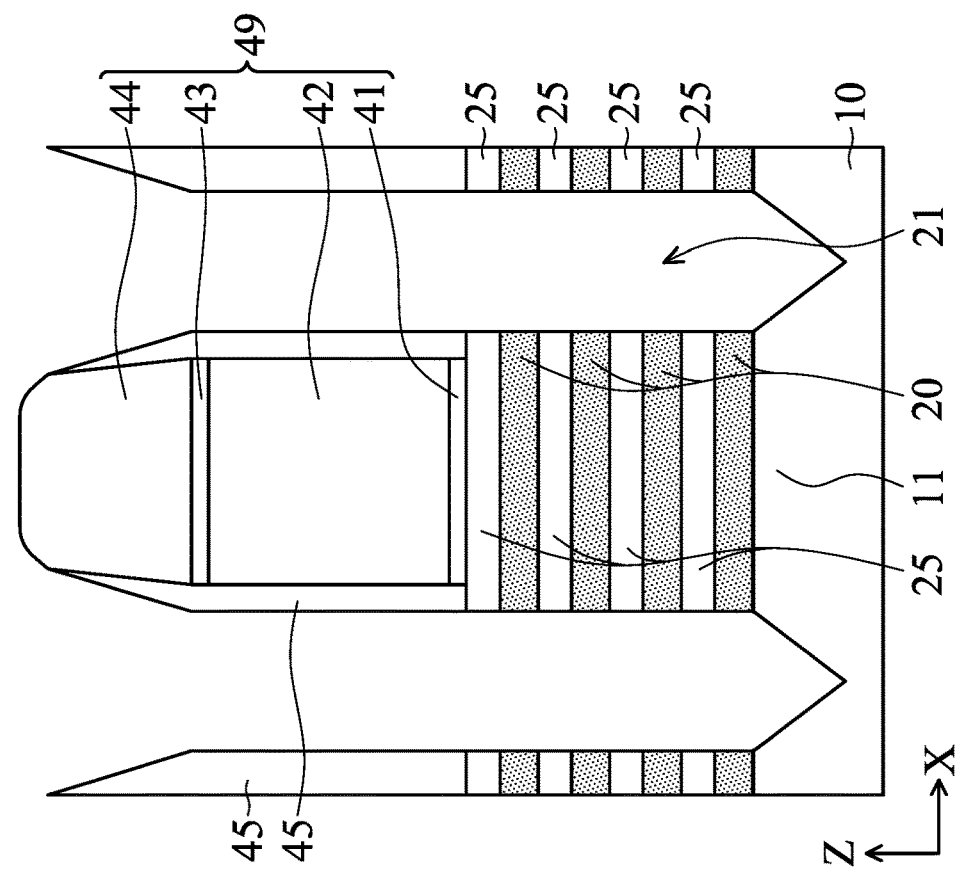
FIG. 6B
FIG. 6A

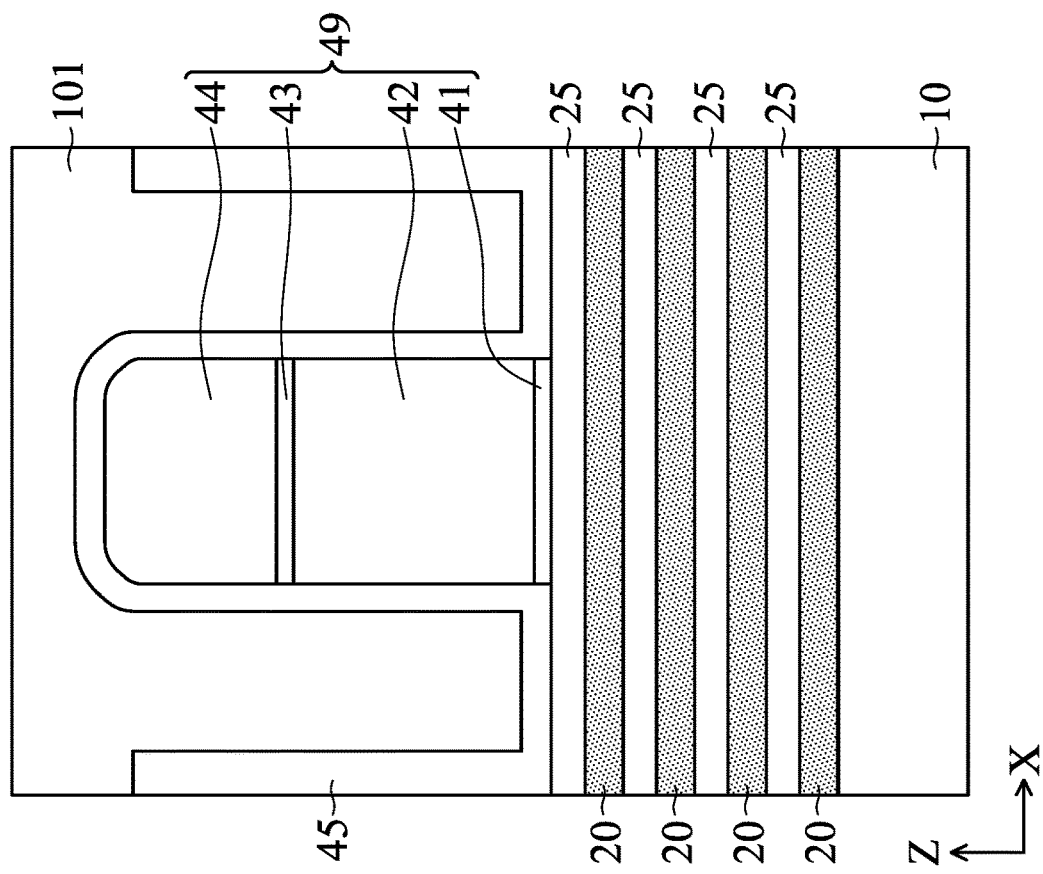
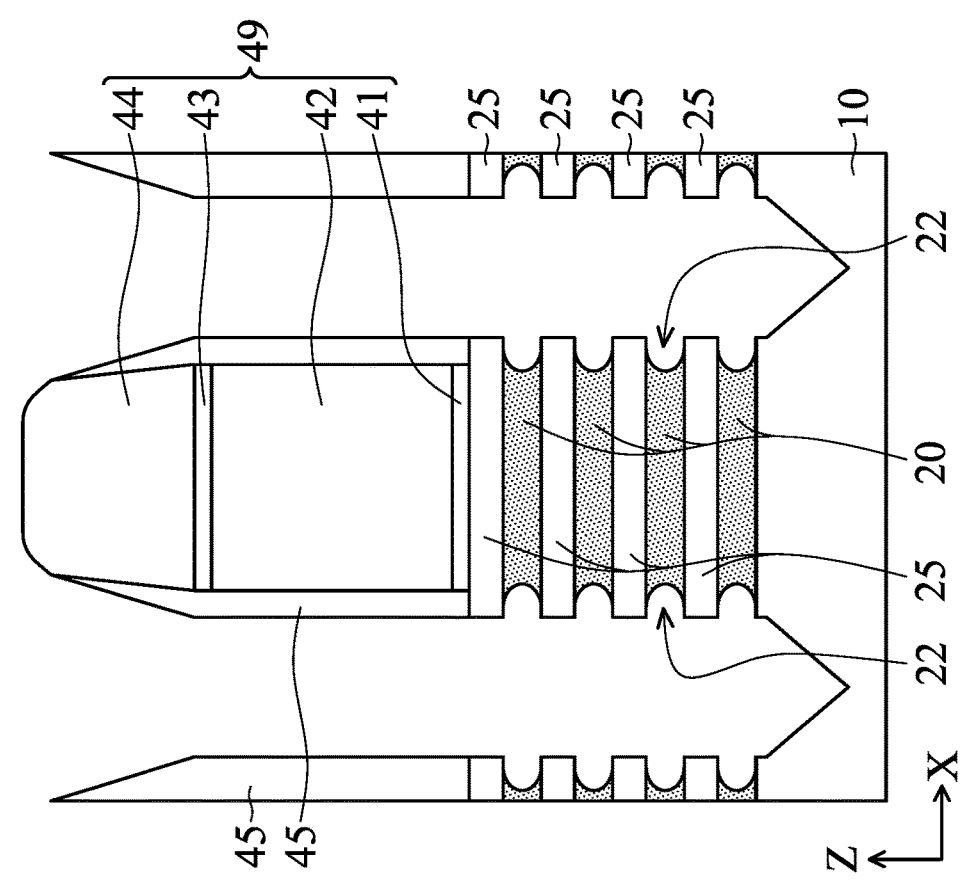

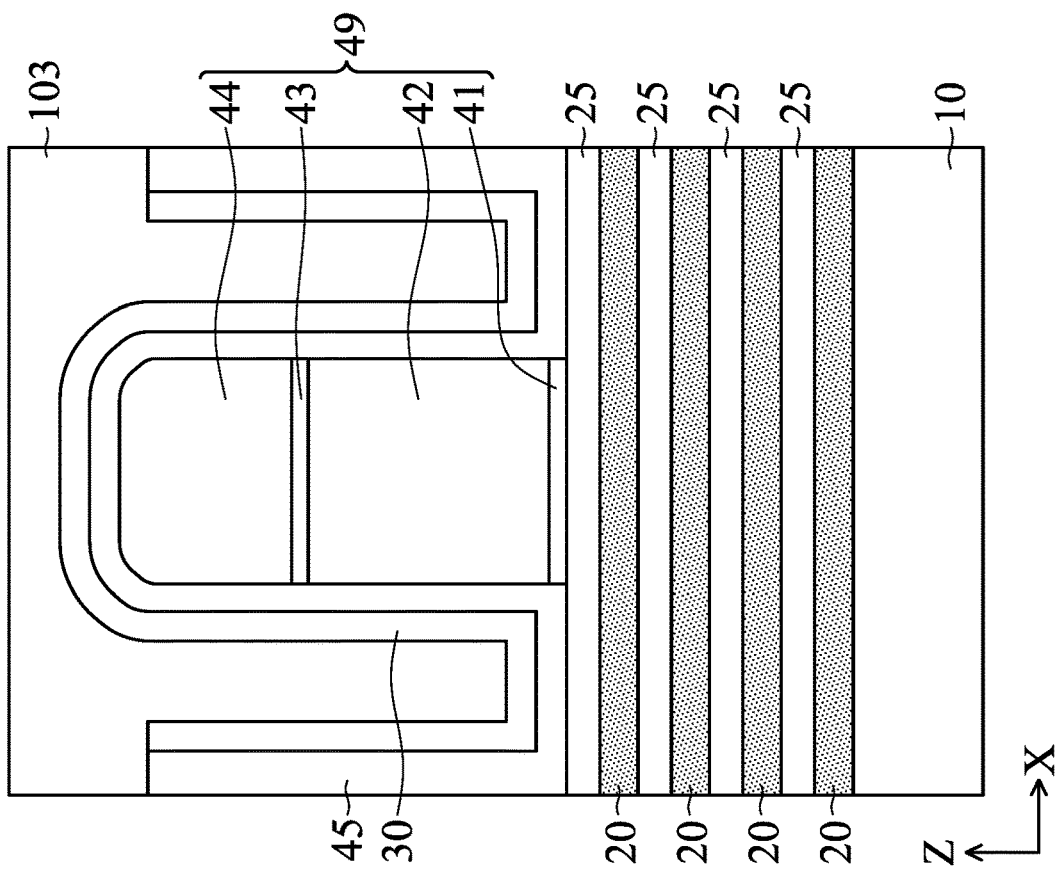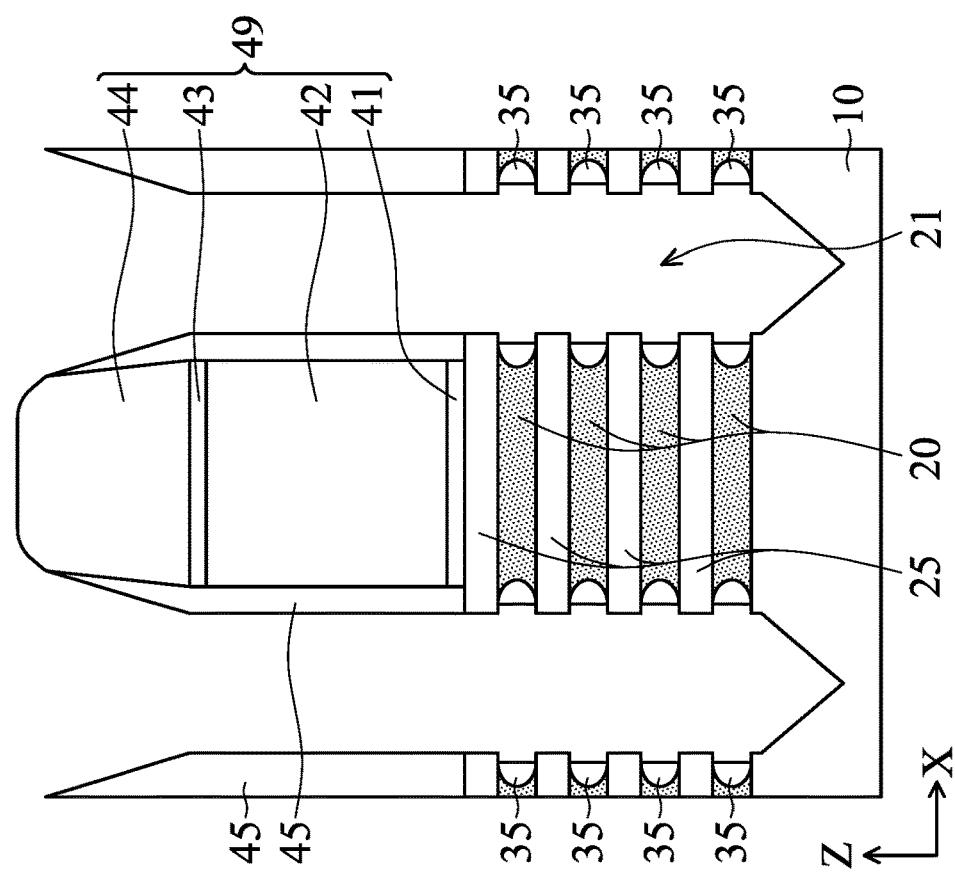
FIG. 9B
FIG. 9A

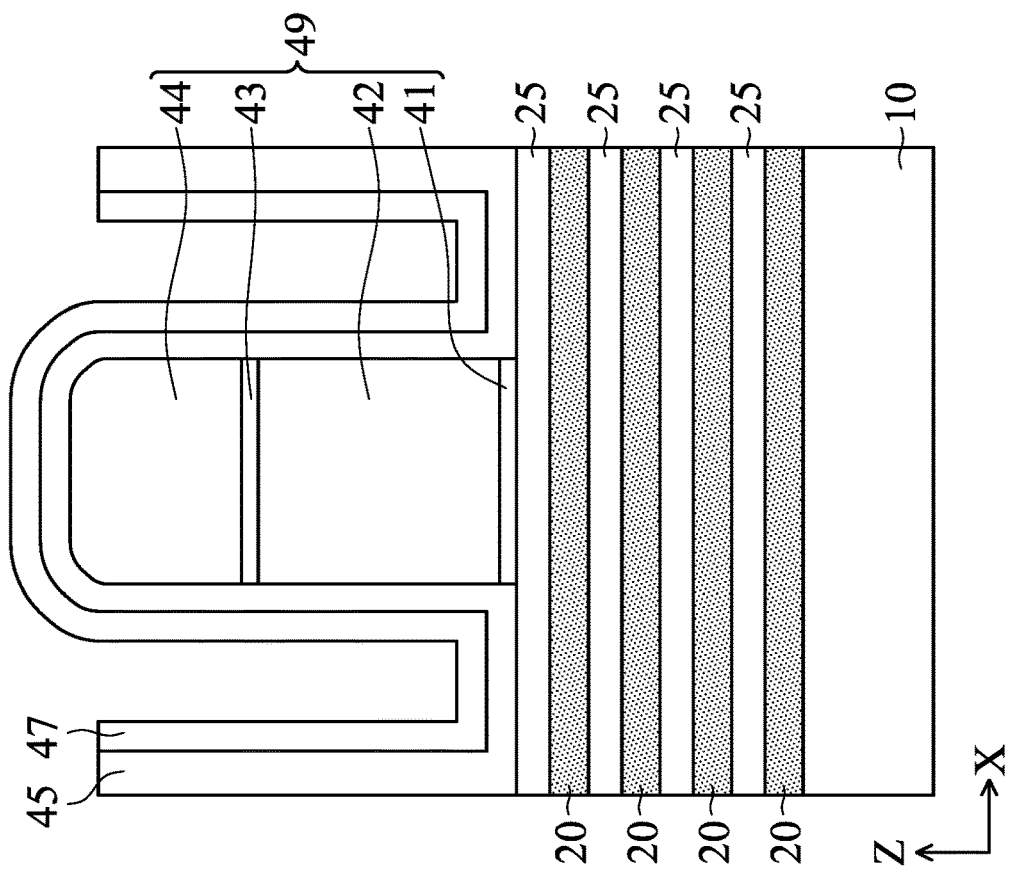
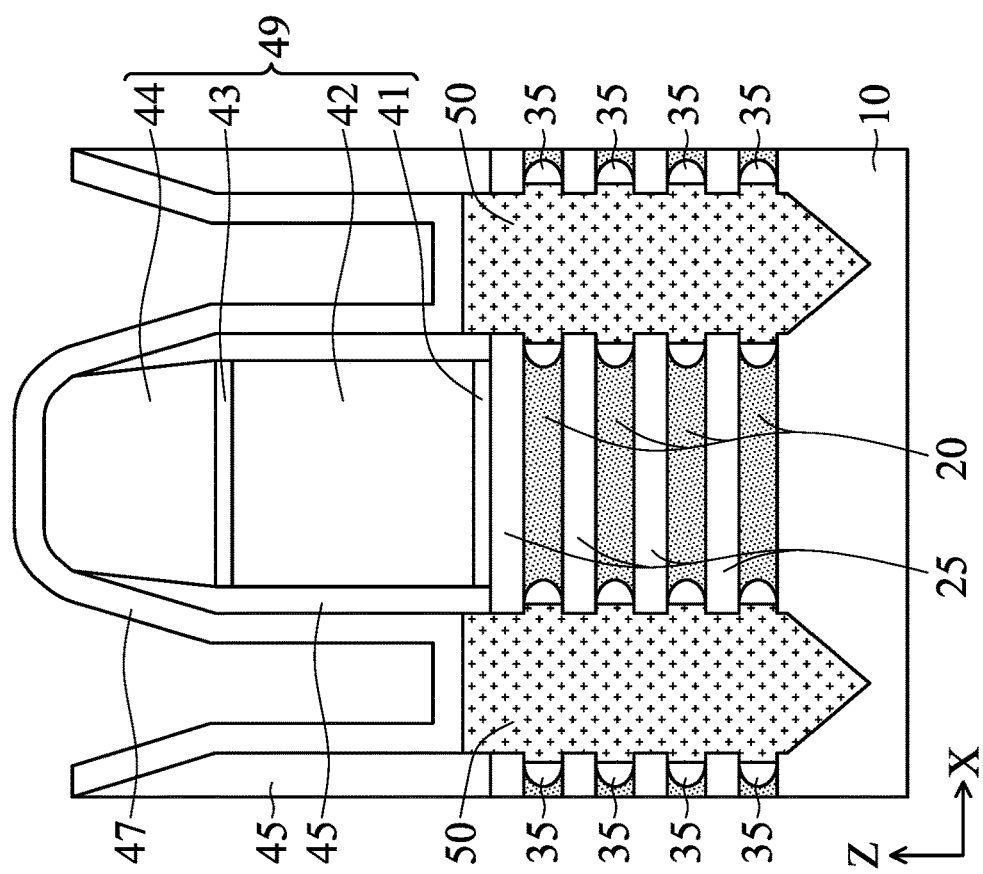
FIG. 11B
FIG. 11A

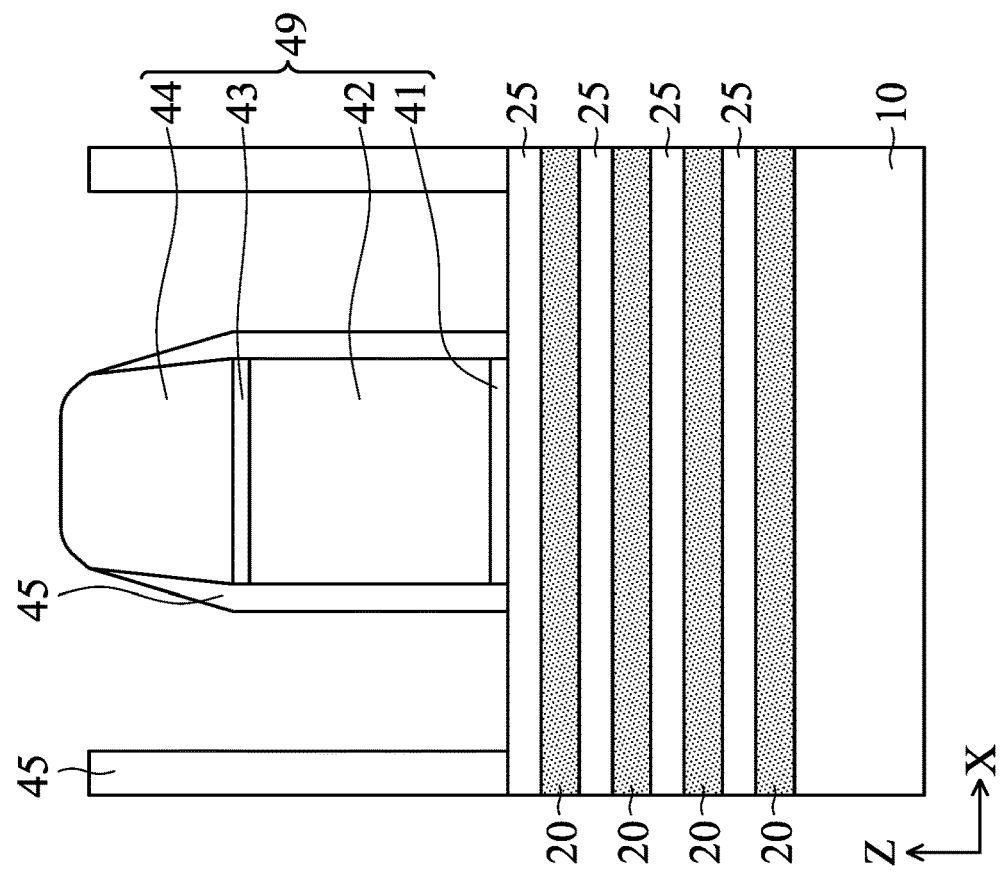
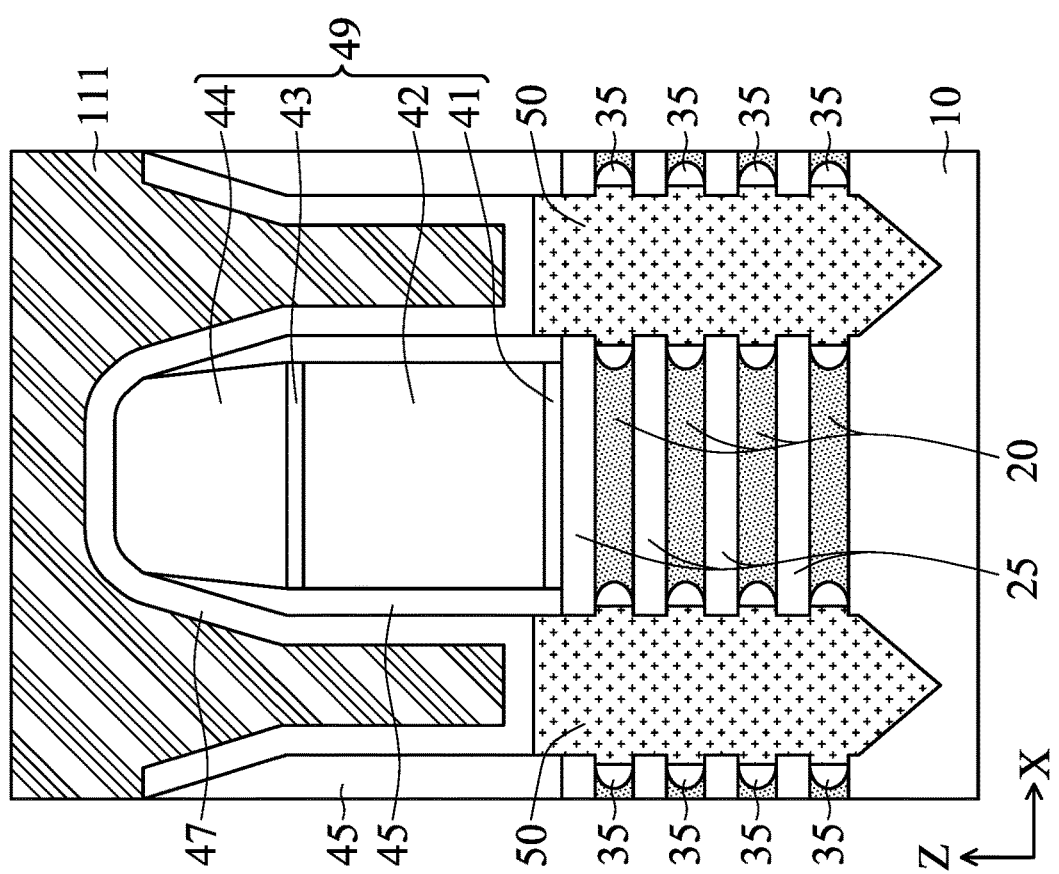

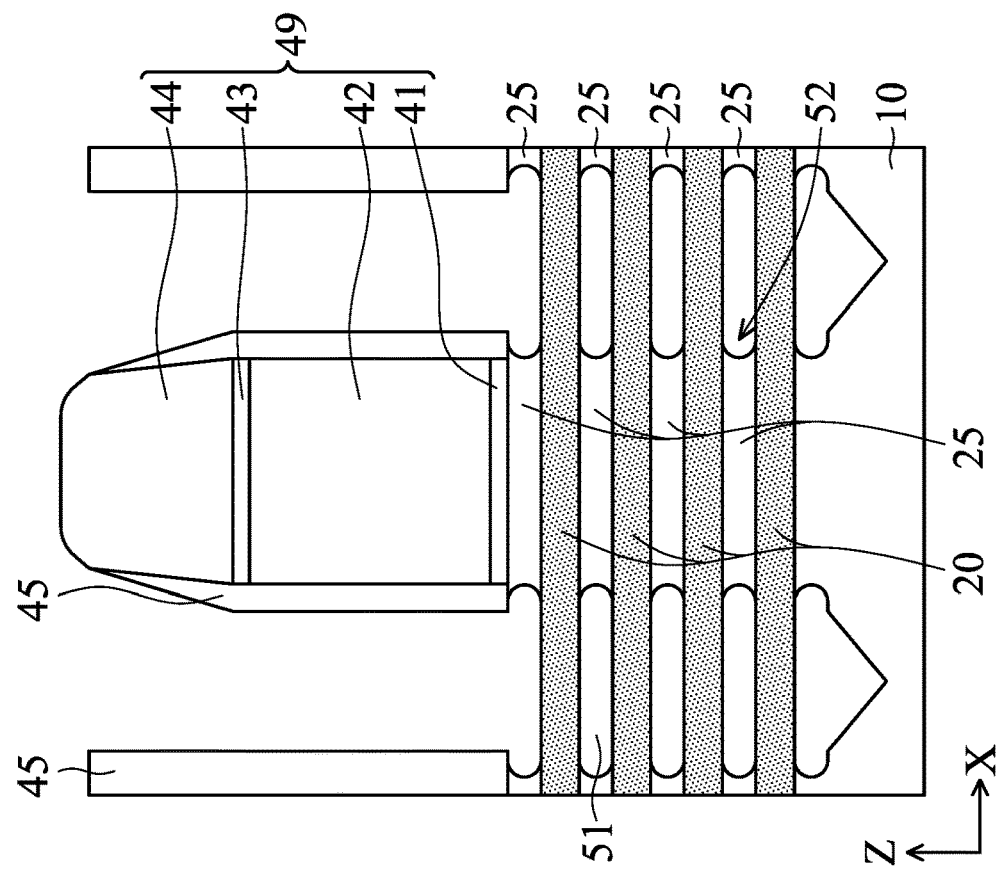
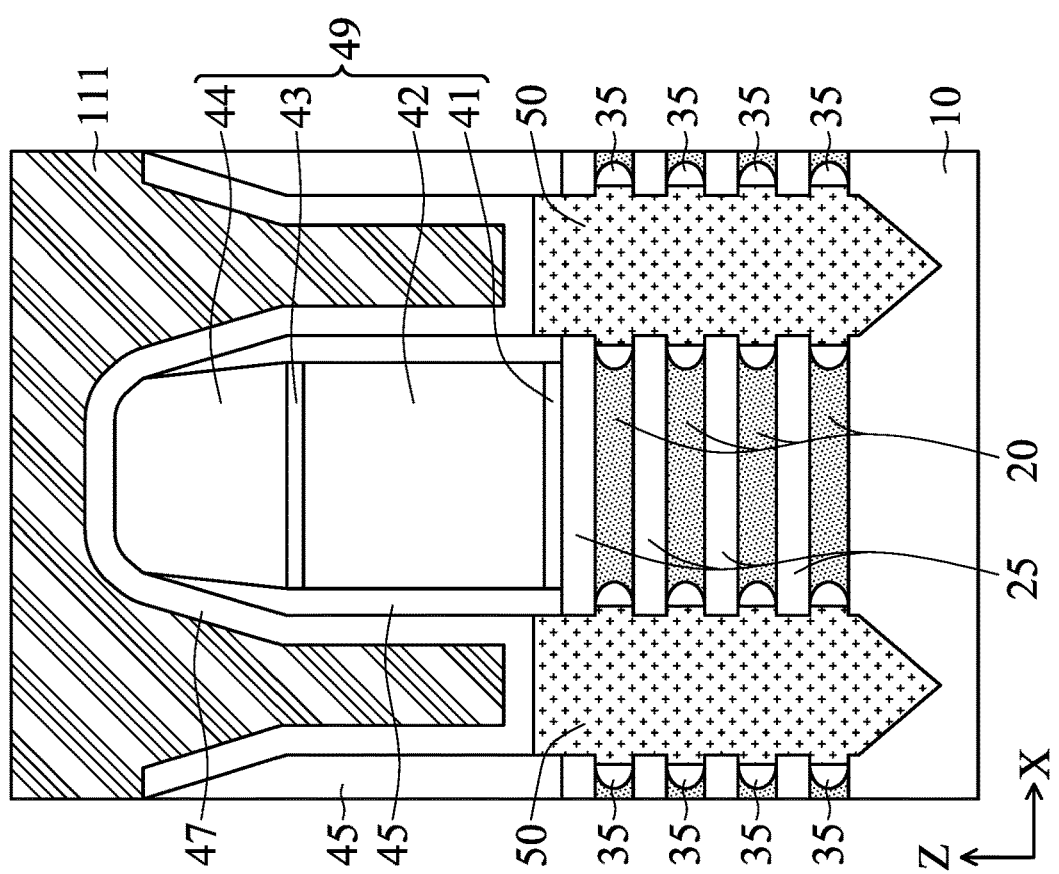
FIG. 14A
FIG. 14B

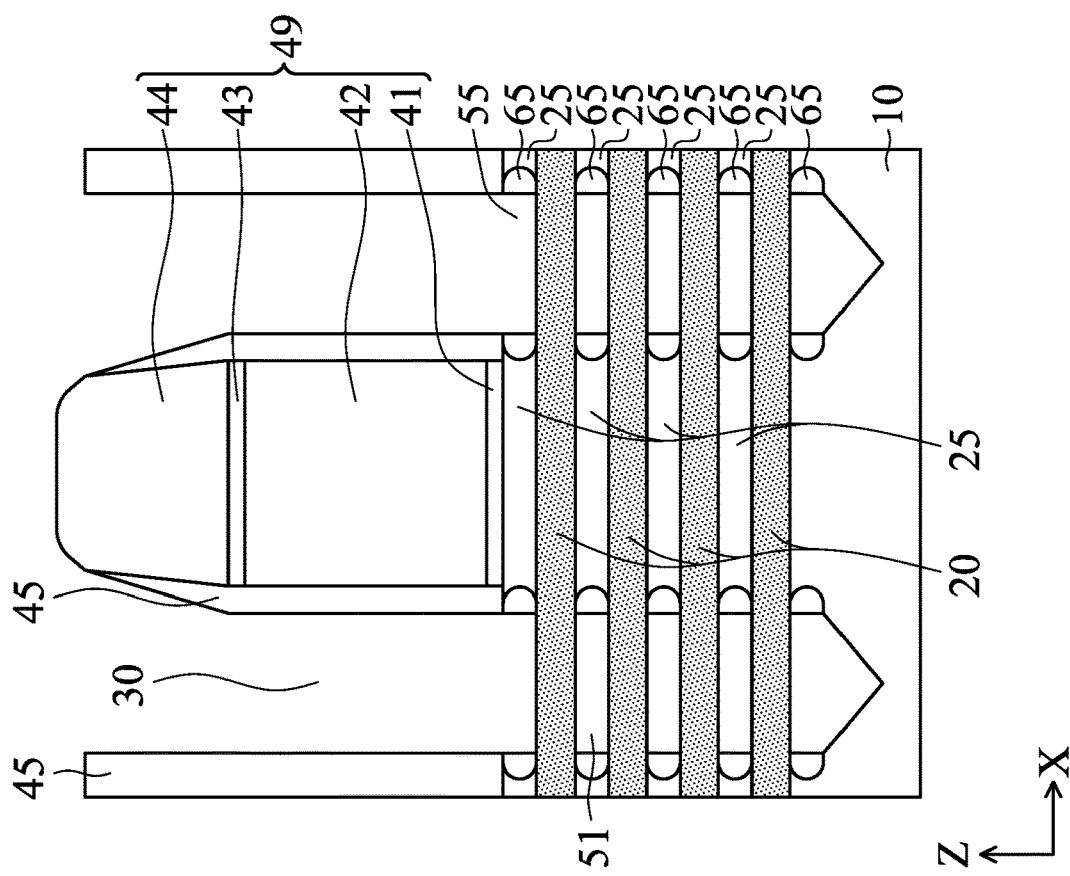
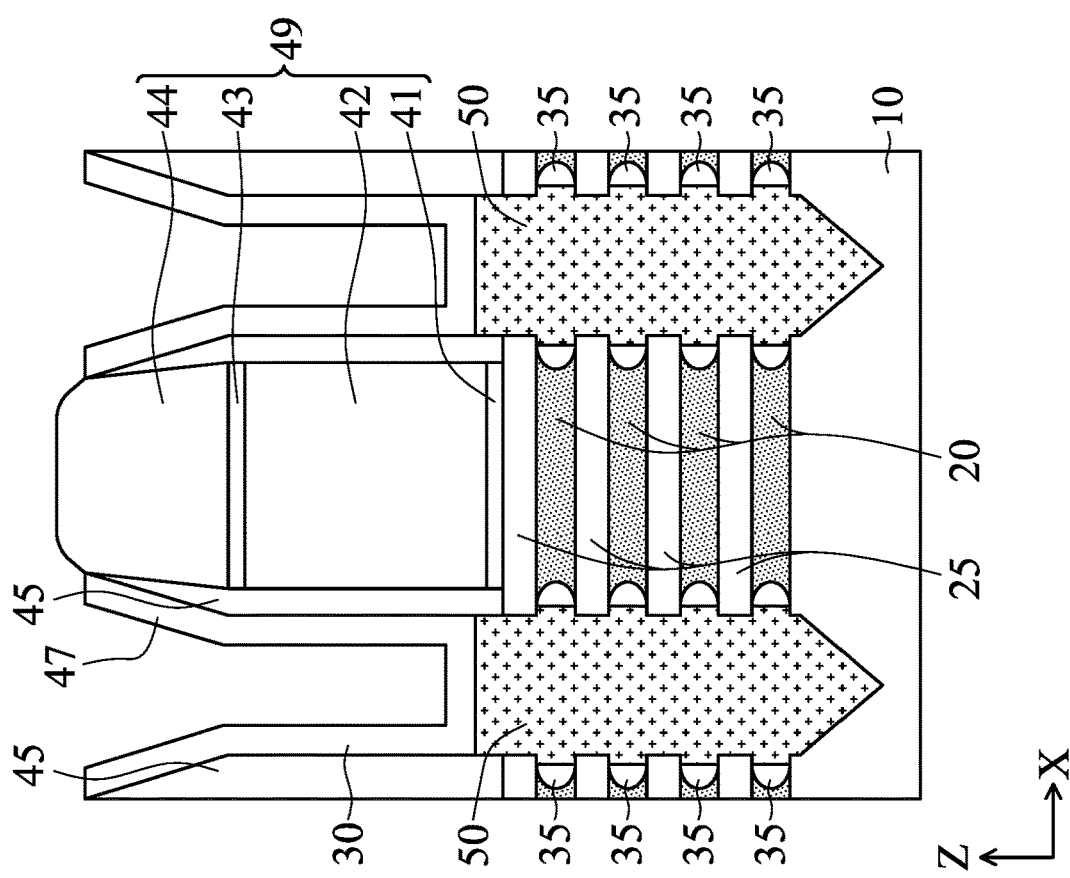

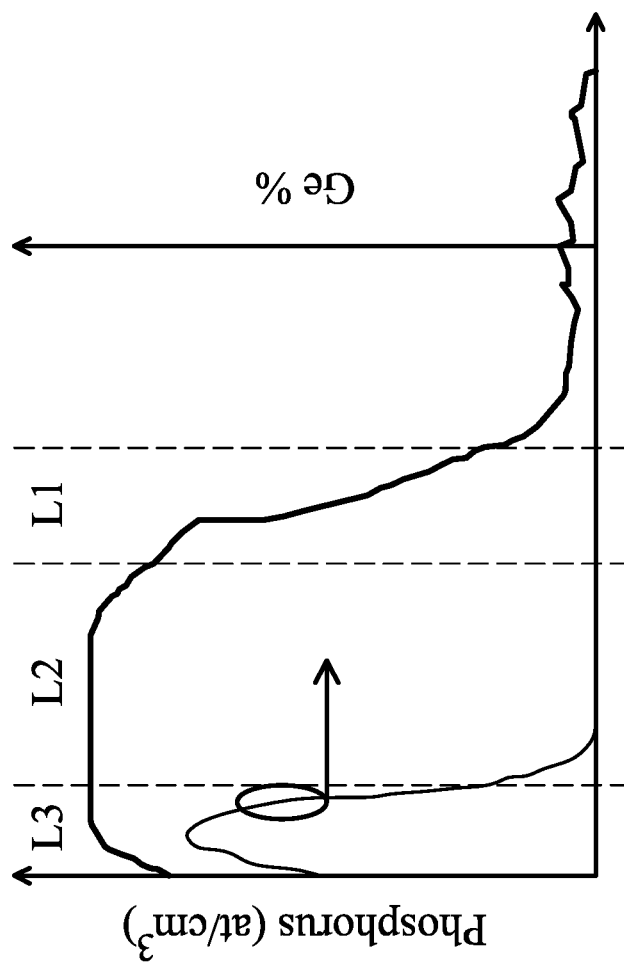
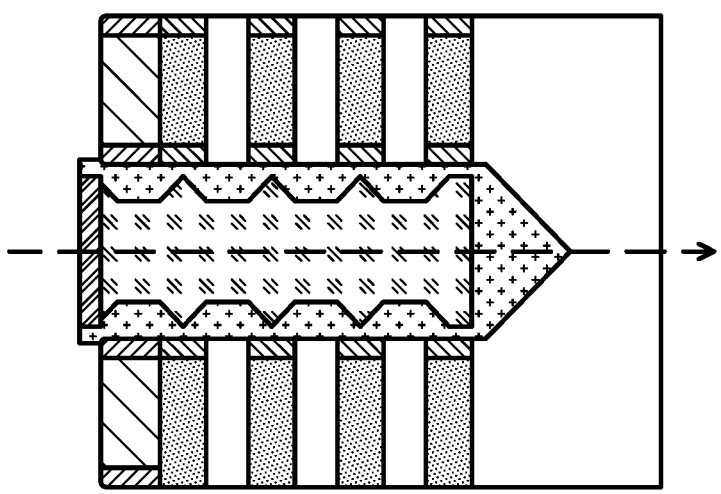
FIG. 21A

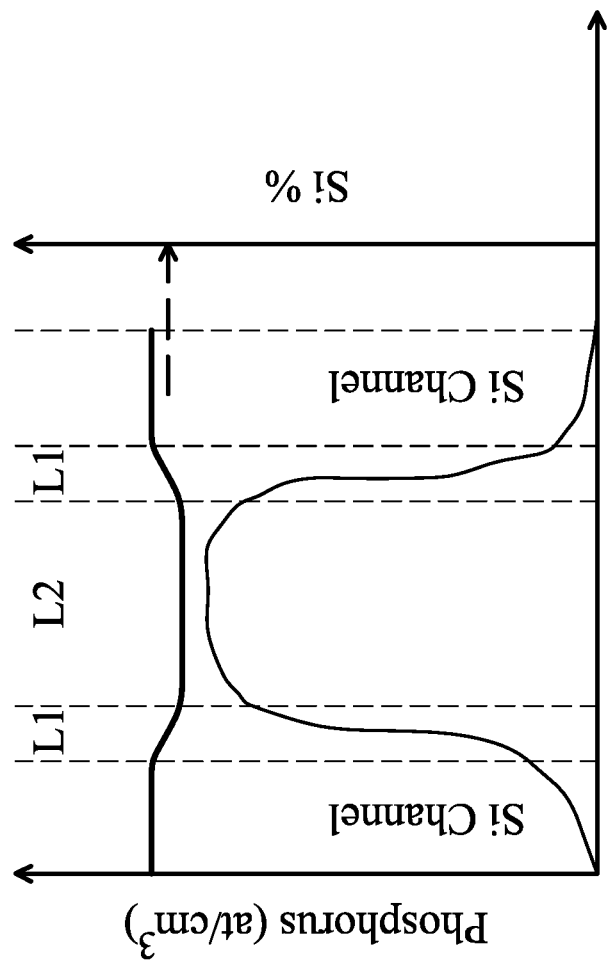
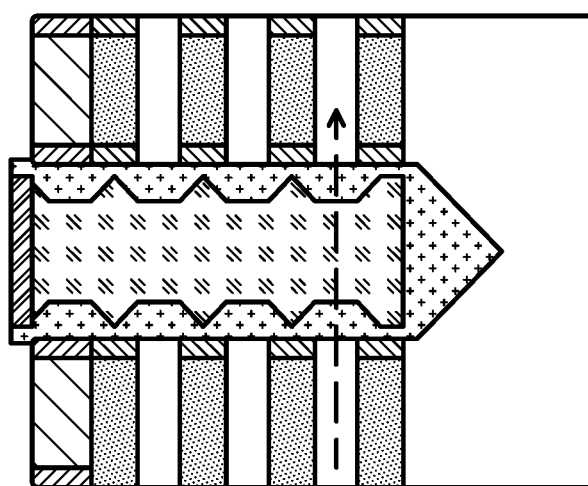
FIG. 21B

US 11,316,046 B2

METHOD OF MANUFACTURING A SEMICONDUCTOR DEVICE AND A SEMICONDUCTOR DEVICE

RELATED APPLICATION

This application claims priority to U.S. Provisional Application No. 62/982,716 filed Feb. 27, 2020, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A.

FIGS. 2A-2D show various views of a semiconductor FET device according to an embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A.

FIGS. 6A and 6B show one of the various stages of manufacturing a semiconductor GAA FET device according to an embodiment of the present disclosure. FIG. 6A shows a cross sectional view for an n-type GAA FET, and FIG. 6B shows a cross sectional view for a p-type GAA FET.

FIGS. 7A and 7B show one of the various stages of manufacturing a semiconductor GAA FET device according to an embodiment of the present disclosure. FIG. 7A shows a cross sectional view for an n-type GAA FET, and FIG. 7B shows a cross sectional view for a p-type GAA FET.

FIG. 8A shows a cross sectional view for an n-type GAA FET, and FIG. 8B shows a cross sectional view for a p-type GAA FET.

FIGS. 9A and 9B show one of the various stages of manufacturing a semiconductor GAA FET device according to an embodiment of the present disclosure. FIG. 9A shows a cross sectional view for an n-type GAA FET, and FIG. 9B shows a cross sectional view for a p-type GAA FET.

FIG. 10A shows a cross sectional view for an n-type GAA FET, and FIG. 10B shows a cross sectional view for a p-type GAA FET.

FIGS. 11A and 11B show one of the various stages of manufacturing a semiconductor GAA FET device according to an embodiment of the present disclosure. FIG. 11A shows a cross sectional view for an n-type GAA FET, and FIG. 11B shows a cross sectional view for a p-type GAA FET.

FIGS. 12A and 12B show one of the various stages of manufacturing a semiconductor GAA FET device according to an embodiment of the present disclosure. FIG. 12A shows a cross sectional view for an n-type GAA FET, and FIG. 12B shows a cross sectional view for a p-type GAA FET.

FIG. 13A shows a cross sectional view for an n-type GAA FET, and FIG. 13B shows a cross sectional view for a p-type GAA FET.

FIGS. 14A and 14B show one of the various stages of manufacturing a semiconductor GAA FET device according to an embodiment of the present disclosure. FIG. 14A shows a cross sectional view for an n-type GAA FET, and FIG. 14B shows a cross sectional view for a p-type GAA FET.

FIG. 15A shows a cross sectional view for an n-type GAA FET, and FIG. 15B shows a cross sectional view for a p-type GAA FET.

FIGS. 16A and 16B show one of the various stages of manufacturing a semiconductor GAA FET device according to an embodiment of the present disclosure. FIG. 16A shows a cross sectional view for an n-type GAA FET, and FIG. 16B shows a cross sectional view for a p-type GAA FET.

FIG. 17A shows a cross sectional view for an n-type GAA FET, and FIG. 17B shows a cross sectional view for a p-type GAA FET.

FIG. 18A shows a cross sectional view for an n-type GAA FET, and FIG. 18B shows a cross sectional view for a p-type GAA FET.

FIG. 19A shows a cross sectional view for an n-type GAA FET, and FIG. 19B shows a cross sectional view for a p-type GAA FET.

FIGS. 21A and 21B show element profiles of the source/drain epitaxial layers according to an embodiment of the present disclosure.

DETAILED DESCRIPTION

Figures 1A, 1B, 1C, 1D:
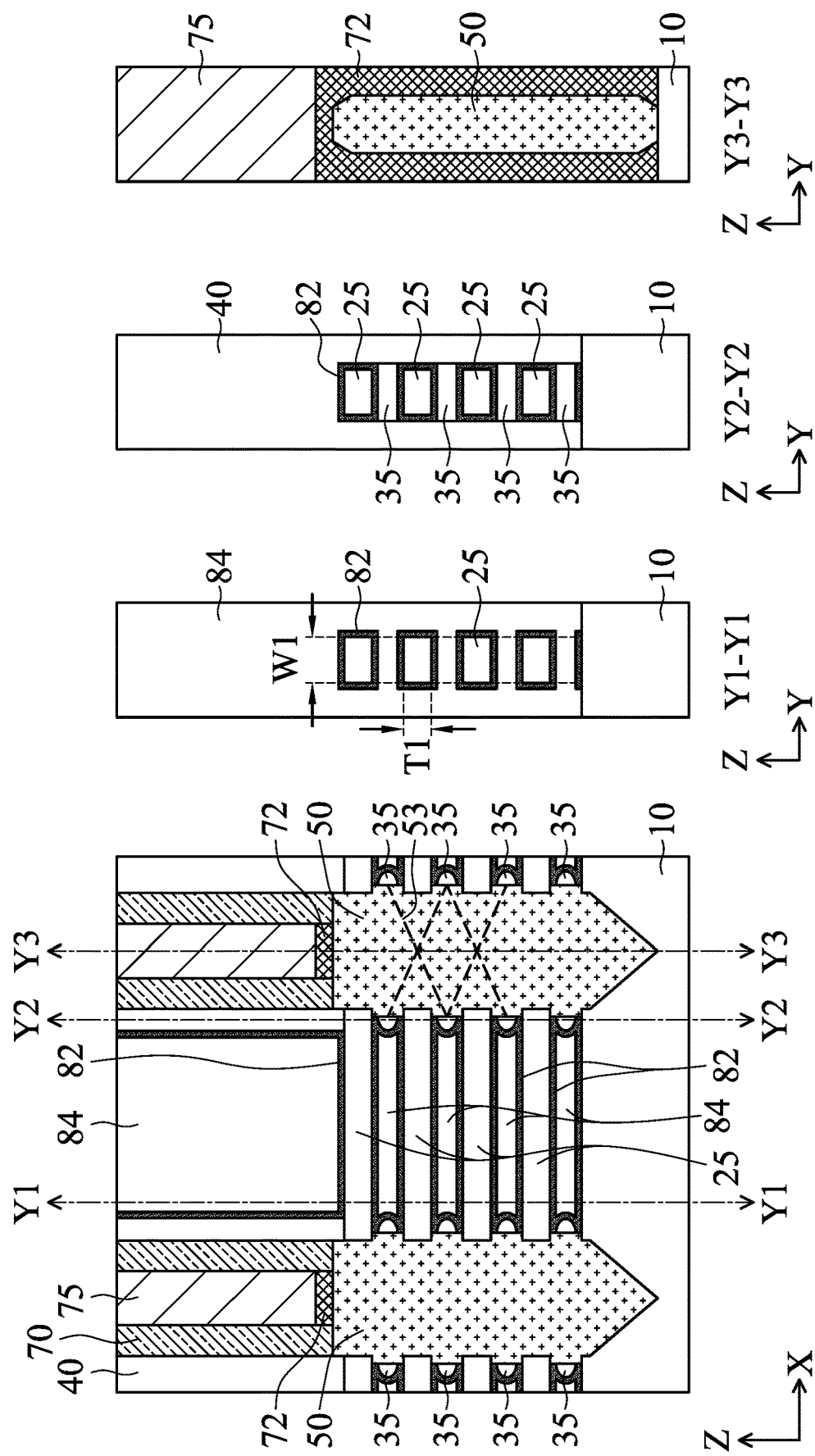
FIGS. 1A-1D show various views of a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, it is difficult to control lateral etching amounts when the nanowires (NWs) are released by selectively etching sacrificial semiconductor layers. The lateral ends of the NWs may be etched when the NW release etching process is performed after a dummy polysilicon gate is removed, because a lateral etching control or an etching budget for NW release etch is not sufficient. A gate electrode may touch a source/drain (source/drain) epitaxial layer if there is no etch stop layer. Further, there are some impacts on gate to drain capacitance (Cgd). If no dielectric film existed between the gate and the source/drain region, Cgd becomes larger, which would reduce circuit speed.

Further, in a GAA FET, an inner spacer is provided between a metal gate electrode and a source/drain (source/drain) epitaxial layer. However, it is difficult to control the shape of the inner spacers due to narrow spaces between adjacent semiconductor layers not to be etched. The inner spacers act as an extra source of channel resistance, thereby hindering the gate control capability. A higher channel height in a GAA FET causes more difficulties in controlling a uniformity of the structure from the channel bottom to the channel top in deposition and etching processes. In particular, achieving a higher process uniformity within a 12-inch wafer becomes more difficult in a GAA FET fabrication method.

In the present disclosure, a novel method for fabricating a source/drain (source and/or drain) epitaxial layer for a GAA FET and a stacked channel FET are provided. In particular, in the present disclosure, the sacrificial semiconductor layers have a modulated composition (e.g., Ge concentration) and the lateral etching of the sacrificial semiconductor layer is controlled by the modulated composition. By employing the modulated composition, it is possible to control the shape of the inner spacers, thereby improving the gate control capability.

In this disclosure, a source/drain refers to a source and/or a drain. It is noted that in the present disclosure, a source and a drain are interchangeably used and the structures thereof are substantially the same.

FIGS. 1A-1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. In some embodiments, the semiconductor GAA FET device of FIGS. 1A-1D is an n-type FET.

As shown in FIGS. 1A-1C, semiconductor wires or sheets 25 are provided over a semiconductor substrate 10, and vertically arranged along the Z direction (the normal direction to the principal surface of the substrate 10). In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires or sheets 25, which are channel layers, are disposed over the substrate 10. In some embodiments, the semiconductor wires 25 are disposed over a fin structure 11 (see, FIG. 4) protruding from the substrate 10. Each of the channel layers 25 is wrapped around by a gate dielectric layer 82 and a gate electrode layer 84. The thickness T1 of the semiconductor wires 25 is in a range from about 5 nm to about 60 nm and the width W1 of the semiconductor wires 25 is in a range from about 5 nm to about 120 nm in some embodiments. In some embodiments, the width of the semiconductor wires or sheets is greater than the thickness. In certain embodiments, the width is up to twice or five times the thickness of the semiconductor wires or sheets 25.

In some embodiments, an interfacial dielectric layer 81 is formed between the channel of the semiconductor wire 25 and the gate dielectric layer 82. In some embodiments, the gate dielectric layer 82 includes a high-k dielectric layer. The gate structure includes the gate dielectric layer 82, the gate electrode layer 84 and sidewall spacers 40. Although FIGS. 1A-1C show four semiconductor wires 25, the number of the semiconductor wires 25 is not limited to four, and may be as small as one or more than four, and may be up to ten. By adjusting the numbers of the semiconductor wires, a driving current of the GAA FET device can be adjusted.

Further, a source/drain epitaxial layer 50 is disposed over the substrate 10. The source/drain epitaxial layer 50 is in direct contact with end faces of the channel layer 25, and is separated by insulating inner spacers 35 and the gate dielectric layer 82 from the gate electrode layer 84. In some embodiments, an additional insulating layer (not shown) is conformally formed on the inner surface of the spacer regions.

In some embodiments, the bottom of the source/drain epitaxial layer 50 penetrates into the fin structure (substrate) and has a V-shape or a triangular shape as shown in FIG. 1A. The substrate at the interface to the source/drain epitaxial layer 50 has (111) surfaces. In some embodiments, the source/drain epitaxial layer 50 includes multiple layers and dislocations 53 as explained below.

An interlayer dielectric (ILD) layer 70 is disposed over the source/drain epitaxial layer 50 and a conductive contact layer 72 is disposed on the source/drain epitaxial layer 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium.

FIGS. 2A-2D show various views of a semiconductor FET device according to another embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A. Material, configuration, dimensions and/or processes the same as or similar to the foregoing embodiments described with respect to FIGS. 1A-1D may be employed in the embodiment of FIGS. 2A-2D, and detailed explanation thereof may be omitted. In some embodiments, the semiconductor GAA FET device of FIGS. 2A-2D is an n-type FET.

In this embodiment, the source/drain epitaxial layer 50 wraps around end portions of the semiconductor wires 25 disposed at the source/drain regions, or the semiconductor wires 25 pass through the source/drain epitaxial layer 50.

In the embodiments of FIGS. 1A-1D and 2A-2D, the GAA FET is an n-type GAA FET. The semiconductor wires 25 are made of Si or $Si_{1-x}Ge_x$, where x is equal to or less than 0.2. The source/drain epitaxial layer 50 is made of one or more of Si, SiP, SiC or SiCP. In some embodiments, the source/drain epitaxial layer 50 further includes a Ge containing layer (e.g., SiGeP) at the top of the source/drain epitaxial layer 50.

In some embodiments, two or more of the GAA FETs shown in FIGS. 1A-4D are disposed on one semiconductor substrate (chip) to achieve various circuit functions.

FIGS. 3 to 19B show various stages of manufacturing a semiconductor FET device according to an embodiment of the present disclosure. In FIGS. 6A-20B, the "A" figures are cross sectional views along the X direction (source-drain direction) for an n-type GAA FET, and the "B" figures are cross sectional views along the X direction for a p-type GAA FET. It is understood that in FIGS. 3-19B, the n-type GAA FET and the p-type GAA FET are formed on the same substrate (a chip) in some embodiments. It is understood that additional operations can be provided before, during, and after processes shown by FIGS. 3-19B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-2D may be employed in the embodiment of FIGS. 3-19B, and detailed explanation thereof may be omitted.

Figure 3:
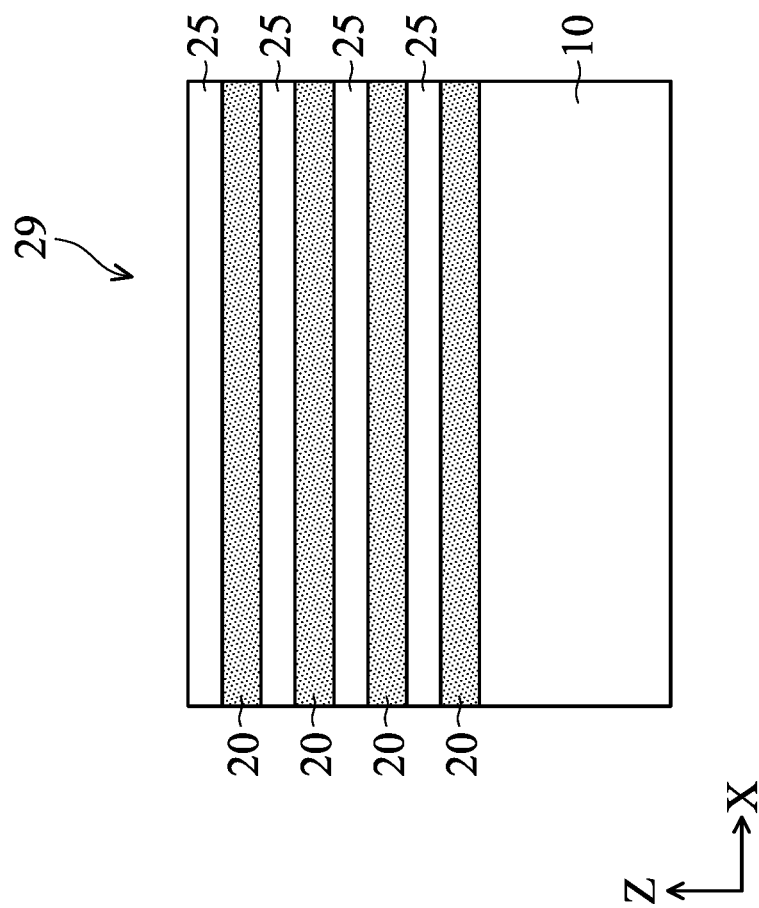
FIG. 3 show one of the various stages of manufacturing a semiconductor GAA FET device according to an embodiment of the present disclosure.

As shown in FIG. 3, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layer 25. Although four first semiconductor layers 20 and four second semiconductor layers 25 are shown in FIG. 3, the numbers are not limited to four, and can be 1, 2, 3 or more than 4, and is less than 20. In some embodiments, the number of the first semiconductor layers 20 is greater by one than the number of the second semiconductor layers 25 (the top layer is the first semiconductor layer).

Figure 4:
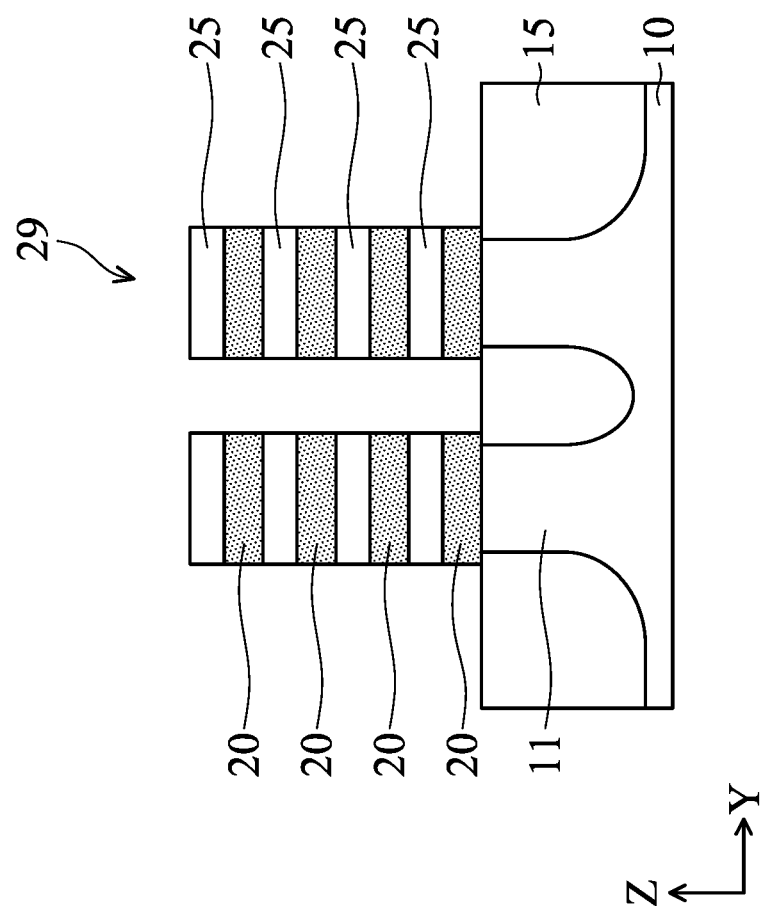
FIG. 4 shows one of the various stages of manufacturing a semiconductor GAA FET device according to an embodiment of the present disclosure.

After the stacked semiconductor layers are formed, fin structures are formed by using one or more lithography and etching operations, as shown in FIG. 4. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 4, the fin structures 29 extend in the X direction and are arranged in the Y direction. The number of the fin structures is not limited to two as shown in FIG. 4, and may be as small as one and three or more. In some embodiments, one or more dummy fin structures are formed on both sides of the fin structures 29 to improve pattern fidelity in the patterning operations. As shown in FIG. 4, the fin structures 29 have upper portions constituted by the stacked semiconductor layers 20, 25 and well portions 11.

The width of the upper portion of the fin structure 29 along the Y direction is in a range from about 10 nm to about 40 nm in some embodiments, and is in a range from about 20 nm to about 30 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one of more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 4, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of an n-type GAA FET. For a p-type GAA FET, the second semiconductor layers 25 are sacrificial layers which are subsequently partially removed, and the first semiconductor layers 20 are subsequently formed into semiconductor wires as channel layers.

Figures 5A, 5B:
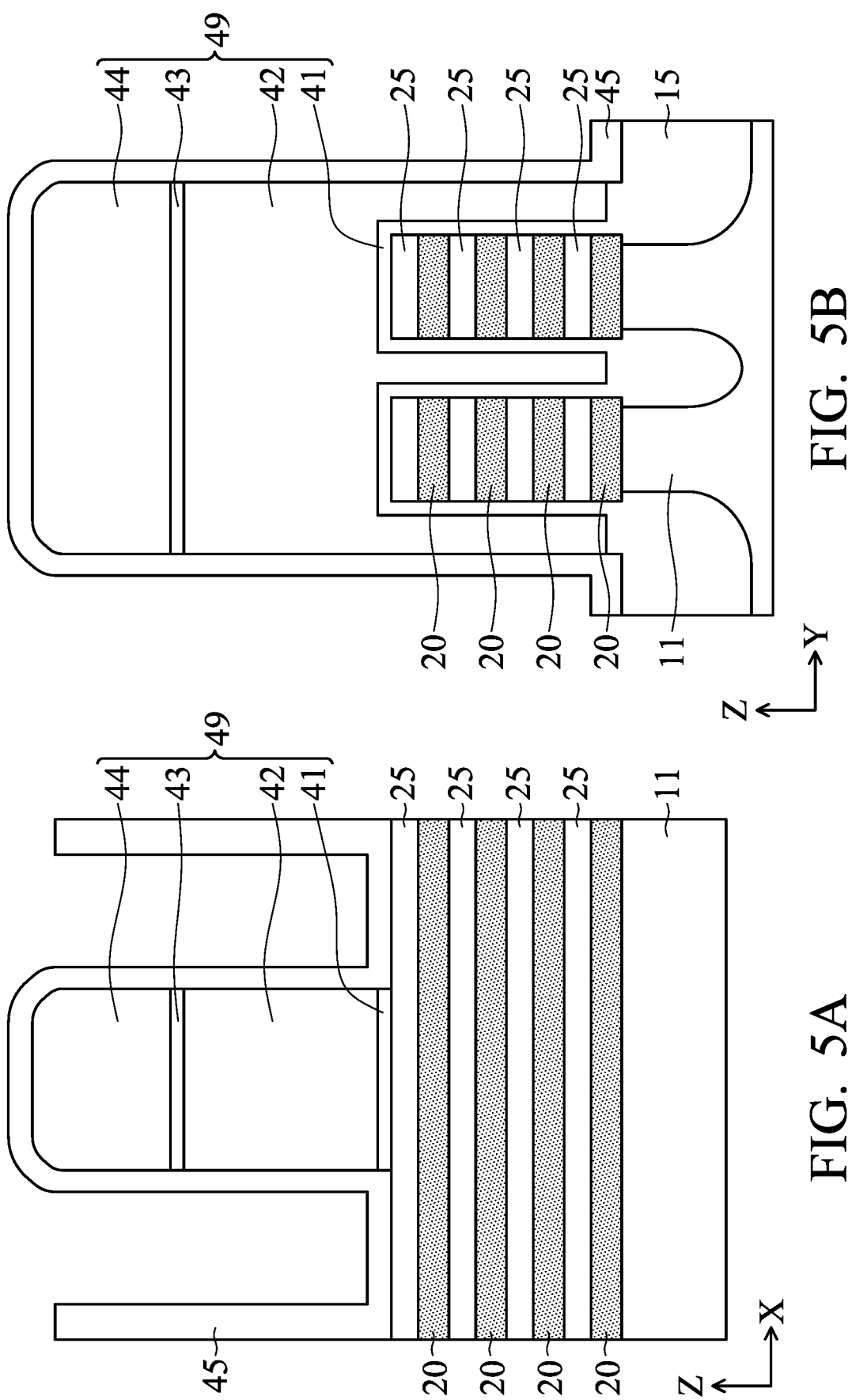
FIGS. 5A and 5B show one of the various stages of manufacturing a semiconductor GAA FET device according to an embodiment of the present disclosure.

After the isolation insulating layer 15 is formed, a sacrificial (dummy) gate structure 49 is formed, as shown in FIGS. 5A and 5B. FIGS. 5A and 5B illustrate a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 49, as shown in FIGS. 5A and 5B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIGS. 5A and 5B. In this disclosure, a source and a drain are interchangeably used and the structures thereof are substantially the same. In FIGS. 5A and 5B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for sidewall spacers is formed over the sacrificial gate structure 49, as shown in FIGS. 5A and 5B. The first cover layer 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, SiON, SiCN, SiCO, SiOCN or any other suitable dielectric material. The cover layer 45 can be formed by ALD or CVD, or any other suitable method.

FIG. 6A shows a cross sectional view along the X direction in an n-type region, and FIG. 6B shows a cross sectional view along the X direction in a p-type region. Next, as shown in FIGS. 6A and 6B, in the n-type region, the first cover layer 45 is anisotropicaly etched to remove the first cover layer 45 disposed on the source/drain region, while leaving the first cover layer 45 as sidewall spacers on side faces of the sacrificial gate structure 49. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part of the fin structures 11) is also partially etched. The p-type region is covered by a protective layer 101, such a photo resist layer, as shown in FIG. 6B.

In some embodiments, as shown in FIG. 6A, the source/drain space 21 penetrates into the well portion 11 of the fin structure. When the substrate 10 is a (100) Si wafer, (111) faces appear at the bottom of the source/drain space 21 forming a V-shape or a triangular shape cross section. In some embodiments, a wet etching using tetramethylammonium hydroxide (TMAH) and/or a chemical dry etching using HCl are employed to form the V-shape profile.

Further, as shown in FIGS. 7A-8C, the first semiconductor layers 20 are laterally etched in the X direction within the source/drain space 21, thereby forming cavities 22.

When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments.

By using the mixed solution, the end of the first semiconductor layer 20 has a curved shape in some embodiments. In some embodiments, the depth, which is an area in which the first semiconductor layer is fully removed, is in a range from about 0.5 nm to about 5 nm and is in a range from about 1 nm to about 3 nm in other embodiments.

After the lateral etching, the protective layer 101 in the p-type region is removed.

Figure 8B:
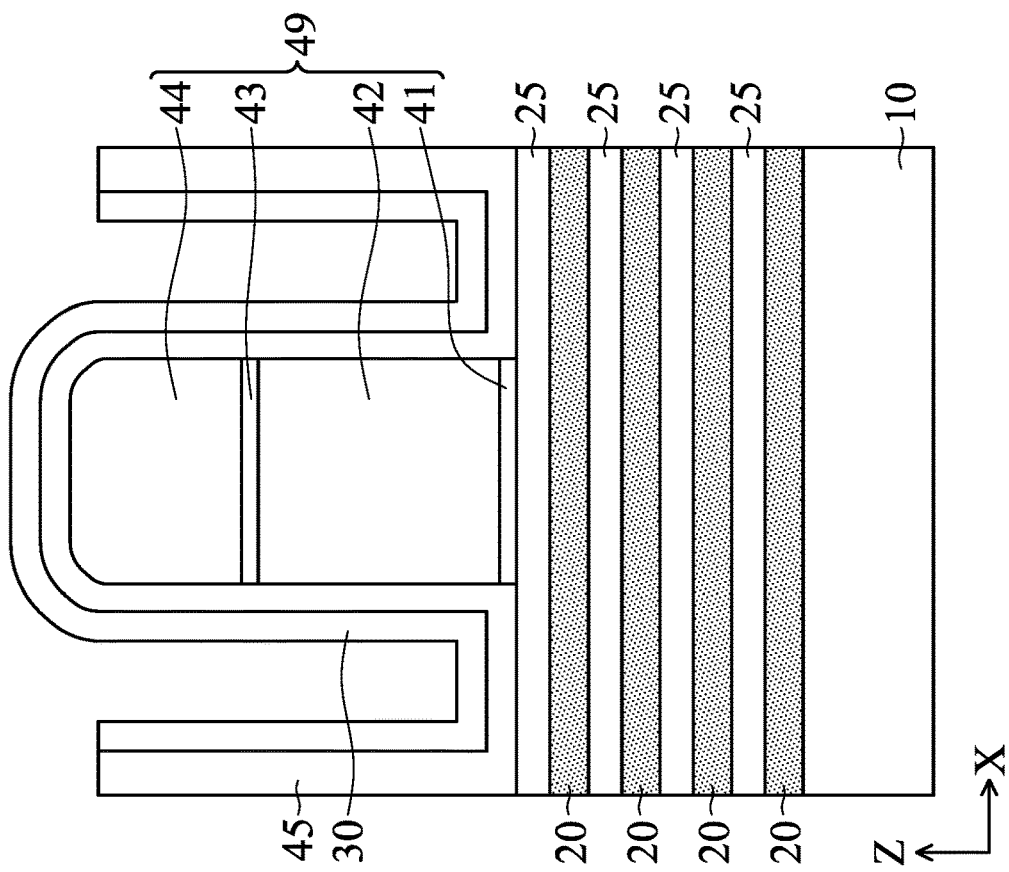
FIGS. 8A and 8B show one of the various stages of manufacturing a semiconductor GAA FET device according to an embodiment of the present disclosure.
Figure 8A:
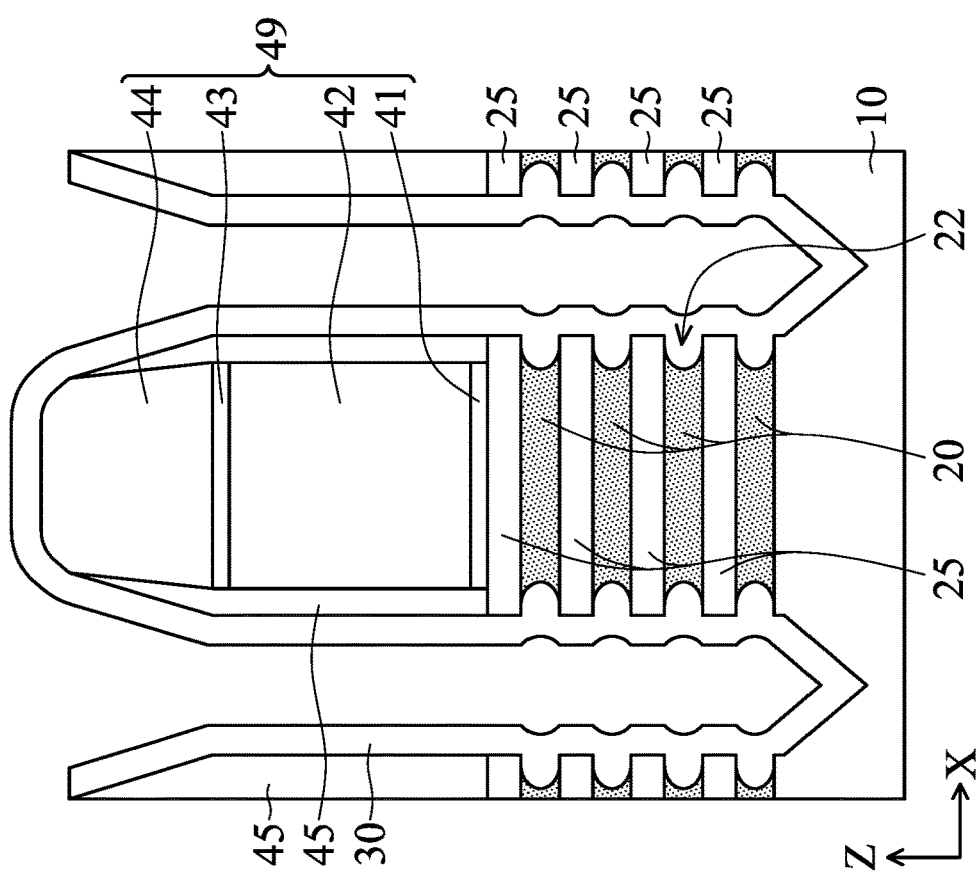

As shown in FIG. 8A, a first insulating layer 30 is conformally formed on the etched lateral ends of the first semiconductor layers 20 and on end faces of the second semiconductor layers 25 in the source/drain space 21 and over the sacrificial gate structure. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 are fully filled with the first insulating layer 30. In the p-type region, the first insulating layer 30 is formed on the first cover layer 45, as shown in FIG. 8B.

After the first insulating layer 30 is formed, an etching operation is performed to partially remove the first insulating layer 30, thereby forming inner spacers 35, as shown in FIG. 9A. In some embodiments, the p-type region is covered by a protective layer 103, for example, a photo resist pattern, as shown in FIG. 9B. In other embodiments, the protective layer 103 is not used, and in such a case, the first insulating layer 30 in the p-type region is simultaneously removed during the etching operation performed in the n-type region. In some embodiments, the end face of the inner spacers 35 is recessed more than the end face of the second semiconductor layers 25 as shown in FIG. 9A. The recessed amount is in a range from about 0.2 nm to about 3 nm and in in a range from about 0.5 nm to about 2 nm in other embodiments. In other embodiments, the recessed amount is less than 0.5 nm and may be equal to zero (the end face of the inner spacer 35 and the end face of the second semiconductor layers 25 are flush with each other).

In some embodiments, before forming the first insulating layer 30, an additional insulating layer having a smaller thickness than the first insulating layer 30 is formed, and thus the inner spacers 35 have a two-layer structure.

Figure 10B:
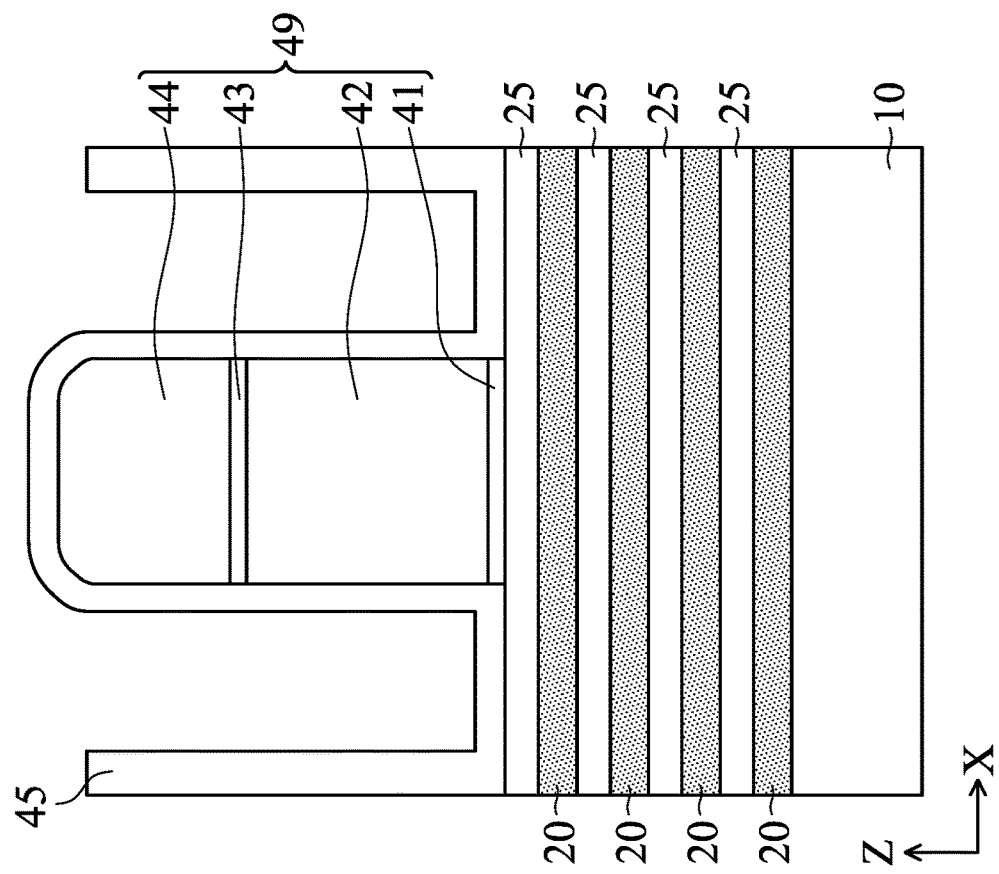
FIGS. 10A and 10B show one of the various stages of manufacturing a semiconductor GAA FET device according to an embodiment of the present disclosure.
Figure 10A:
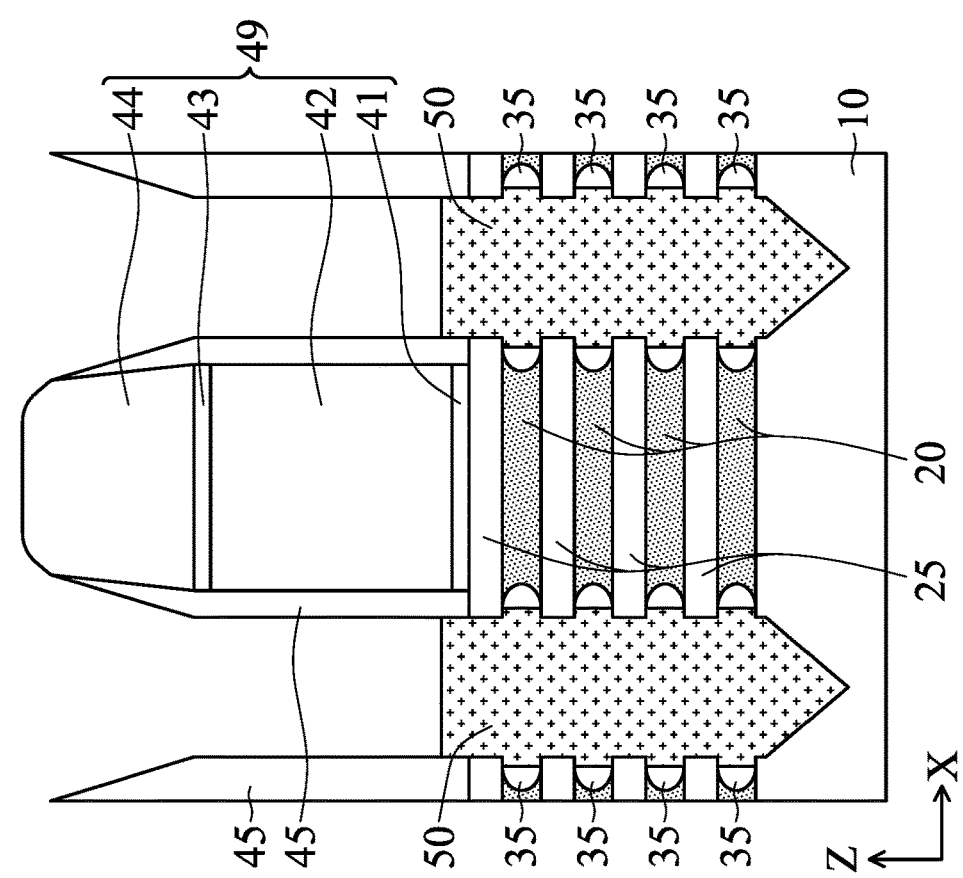

Subsequently, as shown in FIG. 10A, a source/drain epitaxial layer 50 is formed in the source/drain space 21, in the n-type region. The source/drain epitaxial layer 50 includes one or more layers of Si, SiP, SiC and SiCP for an n-channel FET. The source/drain epitaxial layer is formed by an epitaxial growth method using CVD, ALD or molecular beam epitaxy (MBE). As shown in FIGS. 10A and 10B, the source/drain epitaxial layer 50 is selectively formed on semiconductor regions. The source/drain epitaxial layer 50 is formed in contact with end faces of the second semiconductor layers 25, and formed in contact with the inner spacers 35. The details of forming the source/drain epitaxial layer 50 will be explained below with respect to FIGS. 20A-20D, 21 and 22.

Then, as shown in FIGS. 11A and 11B, a second cover layer 47 is formed both in the n-type region and the p-type region. The second cover layer 47 includes one of silicon nitride and silicon oxide, SiON, SiOC, SiCN and SiOCN, or any other suitable dielectric material. The second cover layer 47 is made of a different material than the sidewall spacers (first cover layer) 45. The second insulating layer 47 can be formed by ALD or any other suitable methods.

Next, as shown in FIGS. 12A and 12B, while the n-type region is covered by a protective layer 111, for example, a photo resist pattern, the second cover layer 47 is removed from the p-type region. Further, the first cover layer 45 is anisotropicaly etched to remove the first cover layer 45 disposed on the source/drain region, while leaving the first cover layer 45 as sidewall spacers on side faces of the sacrificial gate structure 49 in the p-type region.

Figure 13A:
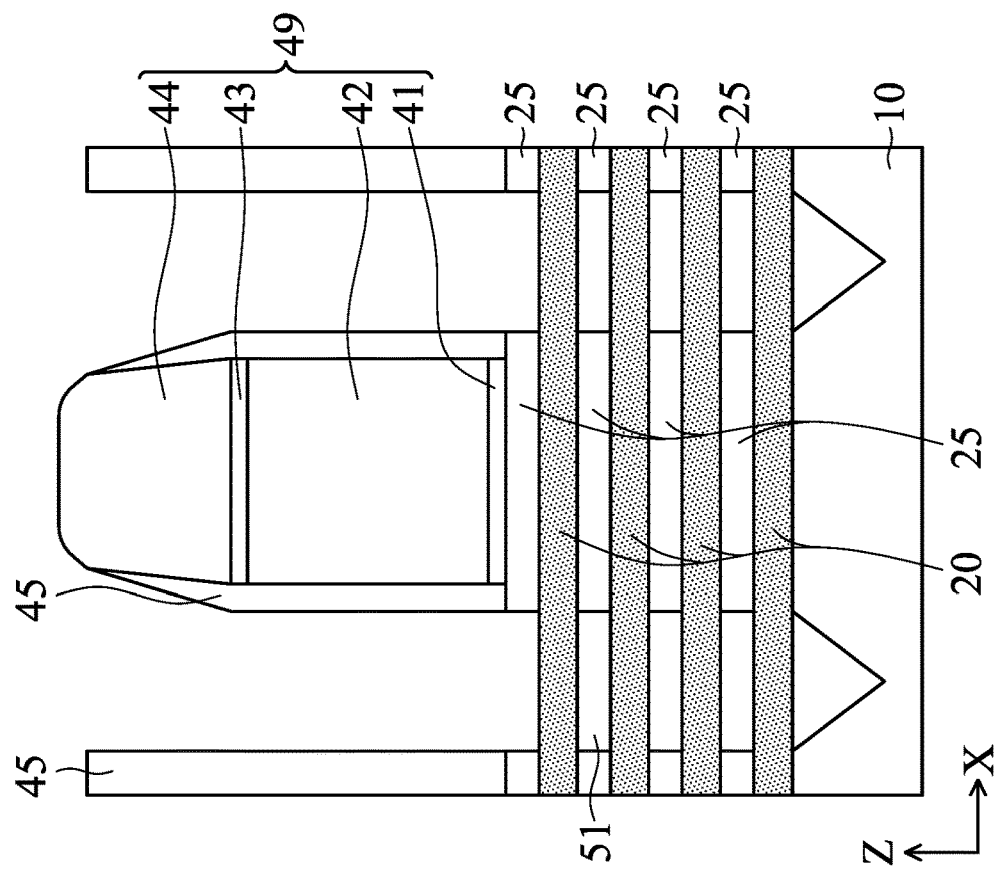
FIGS. 13A and 13B show one of the various stages of manufacturing a semiconductor GAA FET device according to an embodiment of the present disclosure.
Figure 13B:
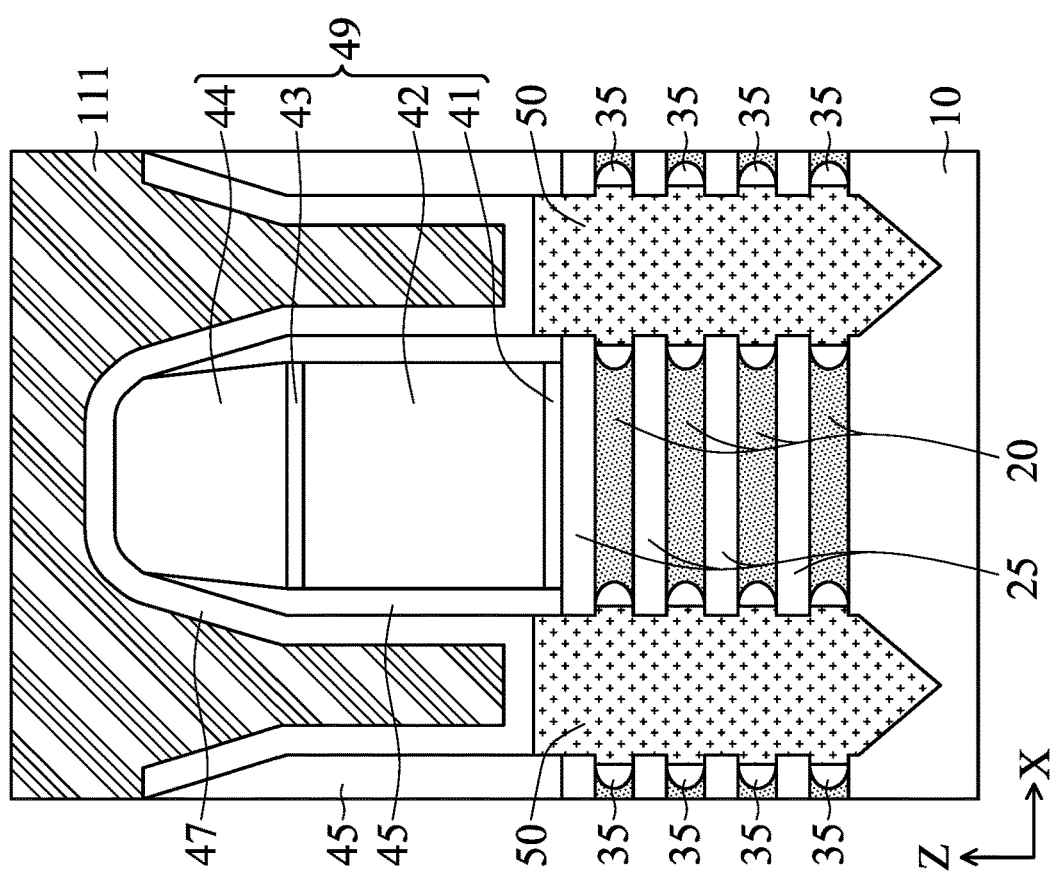

Further, as shown in FIG. 13B, the second semiconductor layer 25 in the source/drain region of the fin structure, which is not covered by the sacrificial gate structure, is etched, thereby leaving the first semiconductor layers 20 remaining in the source/drain region. The n-type region is covered by the protective layer 111 in some embodiments, as shown in FIG. 13A. In other embodiments, the protective layer 111 is removed before etching the source/drain region in the p-type region, and the second cover layer 47 protects the n-type region. In some embodiments, similar to FIG. 6A, (111)

faces appear at the bottom of the source/drain space 51 forming a V-shape or a triangular shape cross section as shown in FIG. 13B.

In addition, the second semiconductor layers 25 are laterally etched in the X direction within the source/drain space 51, thereby forming cavities 52, as shown in FIG. 14B. The amount of etching of the second semiconductor layer 25 is in a range from about 2 nm to about 10 nm in some embodiments. When the first semiconductor layers 20 are SiGe and the second semiconductor layers 25 are Si, the second semiconductor layers 25 can be selectively etched by using a wet etchant such as, but not limited to, an ammonium hydroxide (NH$_4$OH) solution and/or a tetramethylammonium hydroxide (TMAH) solution. The end of the second semiconductor layers 25 have a curved (convex) shape in some embodiments. In other embodiments, the end of the second semiconductor layer 25 has a V-shape (90 degree rotated) or a substantially triangular shape. After the lateral etching, the protective layer 111, if remaining at this stage, in the p-type region is removed.

Figure 15A:
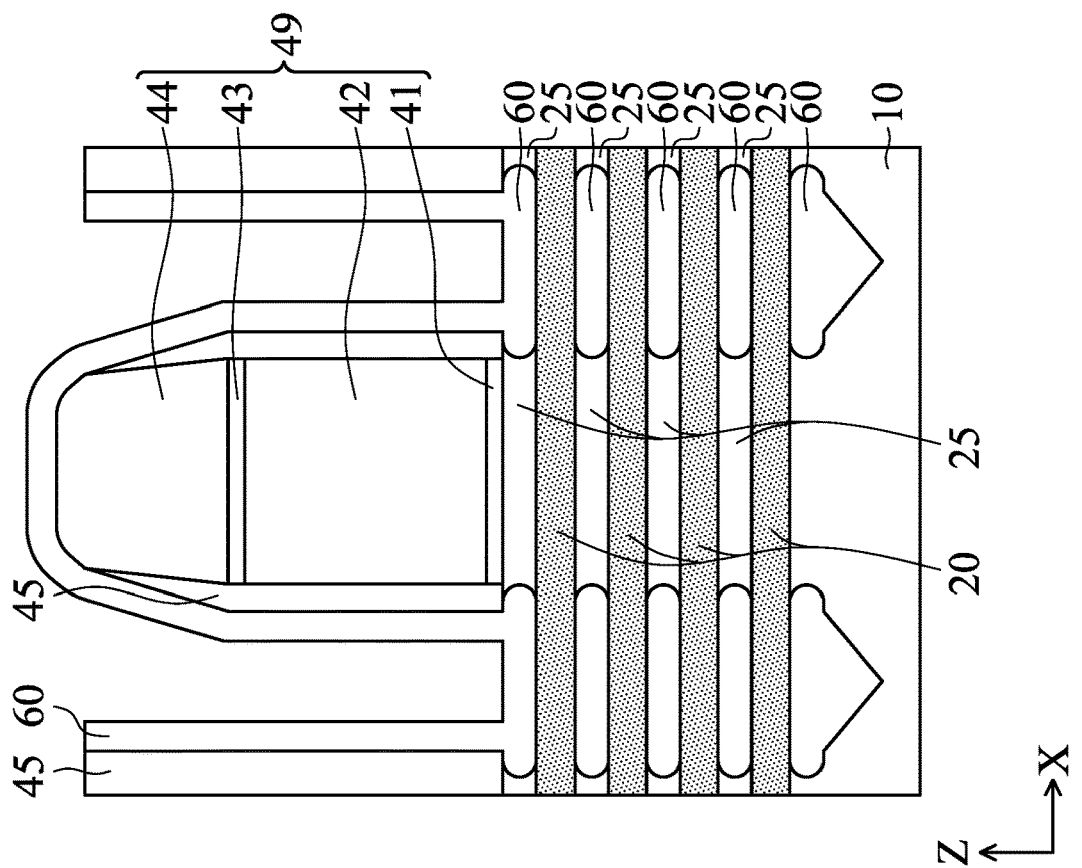
FIGS. 15A and 15B show one of the various stages of manufacturing a semiconductor GAA FET device according to an embodiment of the present disclosure.
Figure 15B:
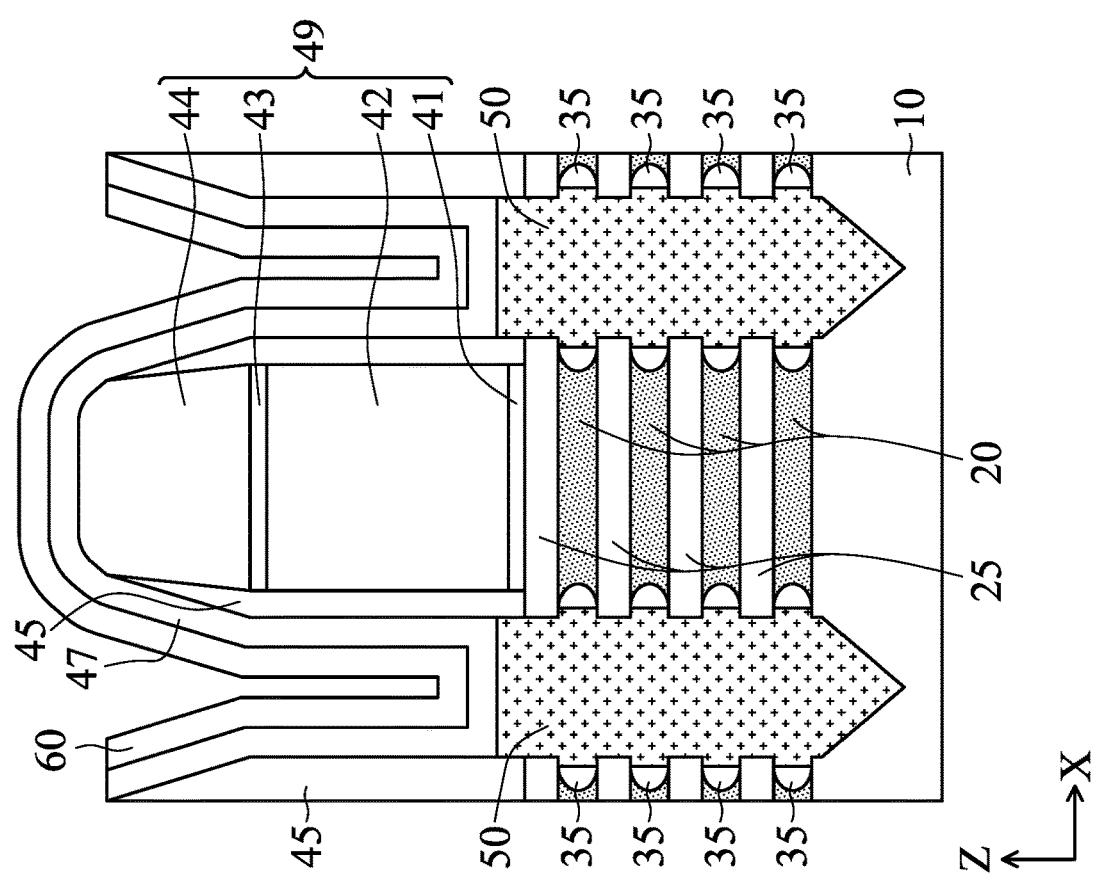

Then, as shown in FIGS. 15A and 15B, a second insulating layer 60 is formed over both the p-type region and the n-type region. In some embodiments, the second insulating layer 60 fully fills the source/drain space 51 between the adjacent first semiconductor layers 20. The second insulating layer 60 includes one of silicon nitride and silicon oxide, SiON, SiOC, SiCN and SiOCN, or any other suitable dielectric material. The second insulating layer 60 is made of a different material than the sidewall spacers (first cover layer) 45. The second insulating layer 60 has a thickness in a range from about 1.0 nm to about 10.0 nm. In other embodiments, the second insulating layer 60 has a thickness in a range from about 2.0 nm to about 5.0 nm. The second insulating layer 60 can be formed by ALD or any other suitable methods. By forming the second insulating layer 60, the cavity 52 is fully filled with the second insulating layer 60. In the n-type region, the second insulating layer 60 is formed on the second cover layer 47, as shown in FIG. 15B.

After the second insulating layer 60 is formed, an etching operation is performed to partially remove the second insulating layer 60, thereby forming inner spacers 65, as shown in FIG. 16B, while the n-type region is covered by the second cover layer 47, as shown in FIG. 16A. In some embodiments, before forming the second insulating layer 60, an additional insulating layer having a smaller thickness than the second insulating layer 60 is formed, and thus the inner spacers 65 has a two-layer structure.

Figure 17A:
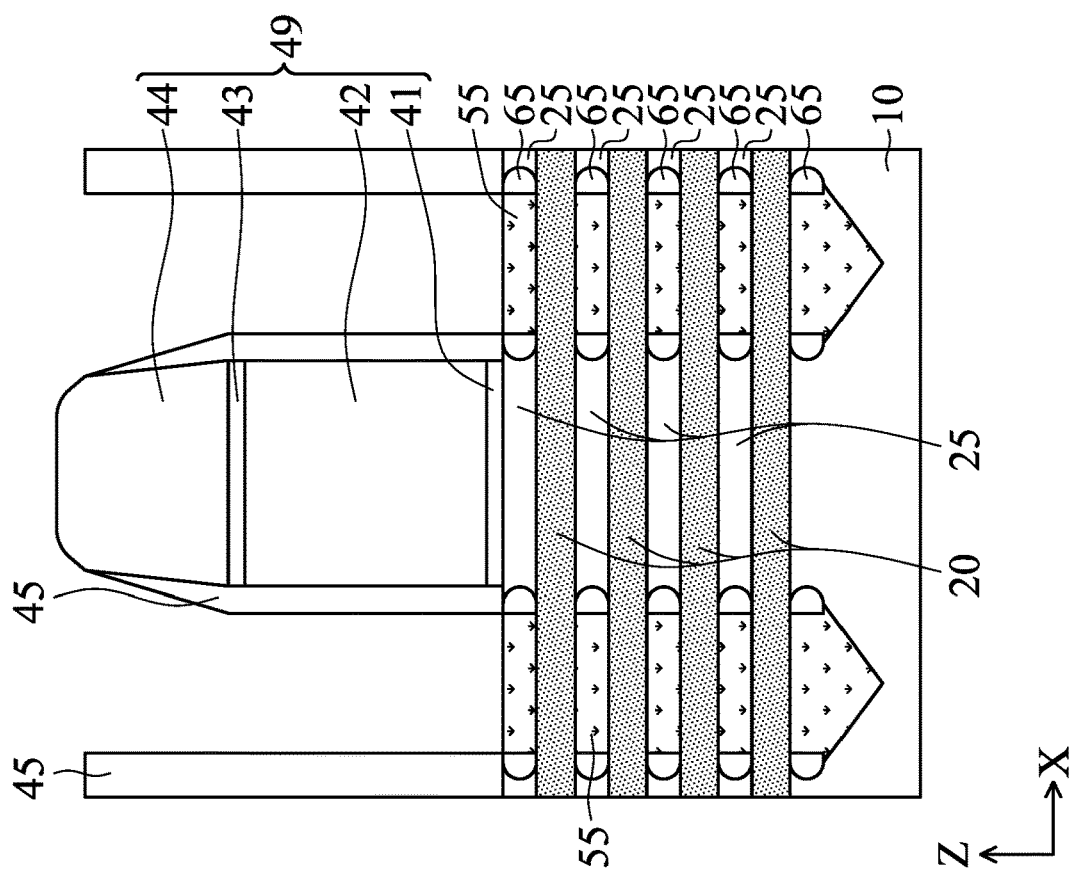
FIGS. 17A and 17B show one of the various stages of manufacturing a semiconductor GAA FET device according to an embodiment of the present disclosure.
Figure 17B:
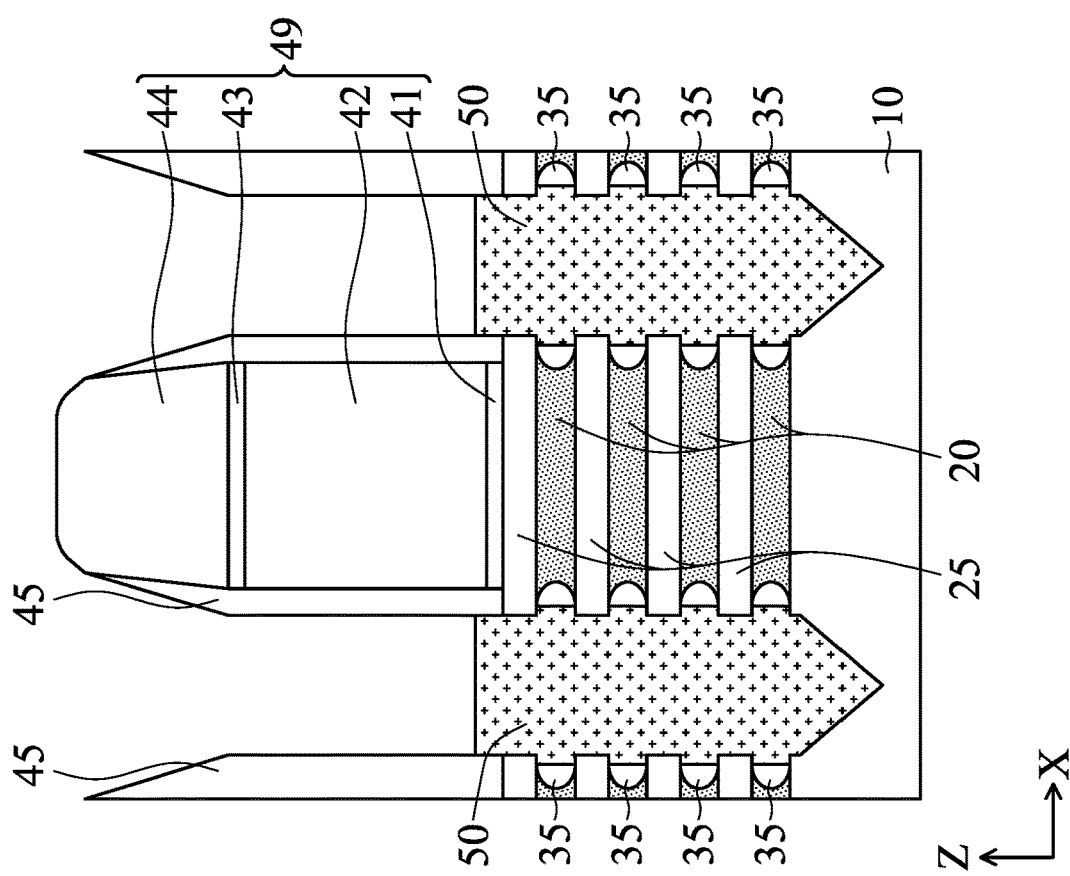

Subsequently, as shown in FIGS. 17A and 17B, a source/drain epitaxial layer 55 is formed in the source/drain space 51, in the p-type region. The source/drain epitaxial layer 55 includes one or more layers of Si, SiGe and Ge for a p-channel FET. For the P-channel FET, boron (B) may also be contained in the source/drain. The source/drain epitaxial layer 55 is formed by an epitaxial growth method using CVD, ALD or molecular beam epitaxy (MBE). The source/drain epitaxial layer 55 is formed to wrap around end portions of the first semiconductor layers 20, and formed in contact with the inner spacers 65. In some embodiments, the first semiconductor layers 20 pass through the source/drain epitaxial layer 55. After the source/drain epitaxial layer 55 is selectively formed on semiconductor regions in the p-type region, the second cover layer 47 in the n-type region is removed, as shown in FIG. 17A.

Subsequently, an interlayer dielectric (ILD) layer 70 is formed over the source/drain epitaxial layers 50 and 55. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed.

Then, the sacrificial gate electrode layer 42 and sacrificial gate dielectric layer 41 are removed. The ILD layer 70 protects the source/drain epitaxial layers 50 and 55 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Figure 18A:
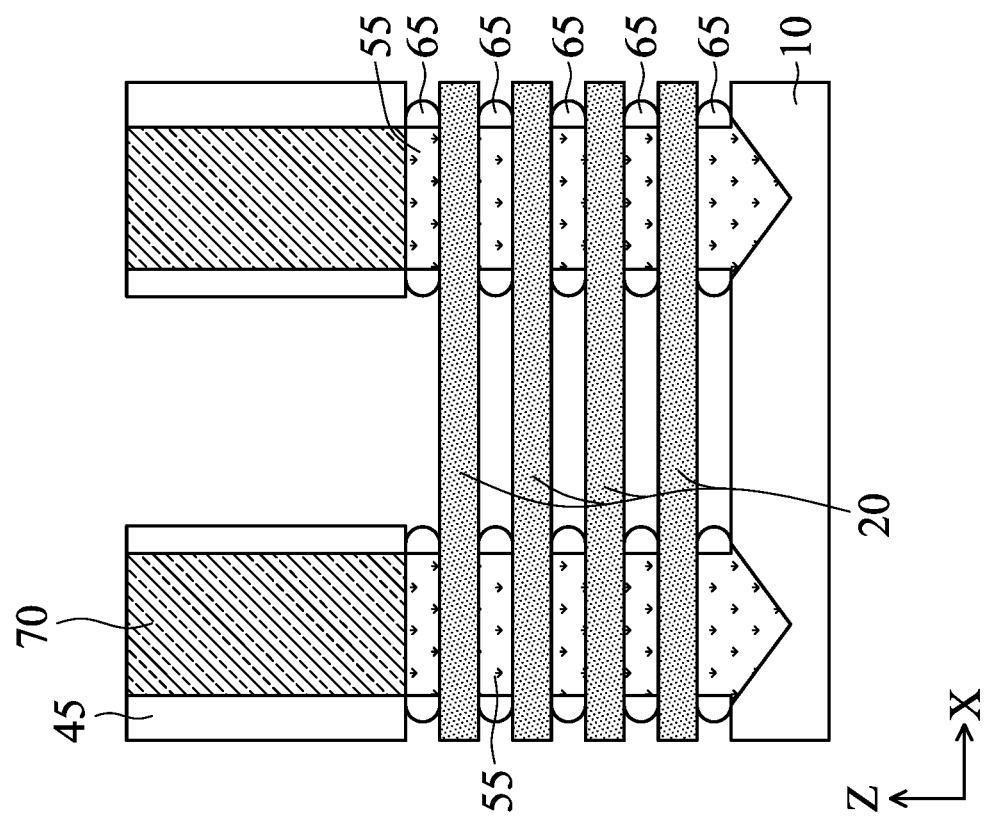
FIGS. 18A and 18B show one of the various stages of manufacturing a semiconductor GAA FET device according to an embodiment of the present disclosure.

After the sacrificial gate structures are removed, the first semiconductor layers 20 are removed in the n-type region, thereby forming wires (channel regions) of the second semiconductor layers 25, as shown in FIG. 18A. The first semiconductor layers 20 can be removed or etched using an etchant that can selectively etch the first semiconductor layers 20 against the second semiconductor layers 25, as set forth above. As shown in FIG. 18A, since the first insulating layers (inner spacers) 35 are formed, the etching of the first semiconductor layers 20 stops at the first insulating layer 35. In other words, the first insulating layer 35 functions as an etch-stop layer for etching of the first semiconductor layers 20. The channel formation operations for the n-type region are performed, while the p-type region is covered by a protective layer.

Figure 18B:
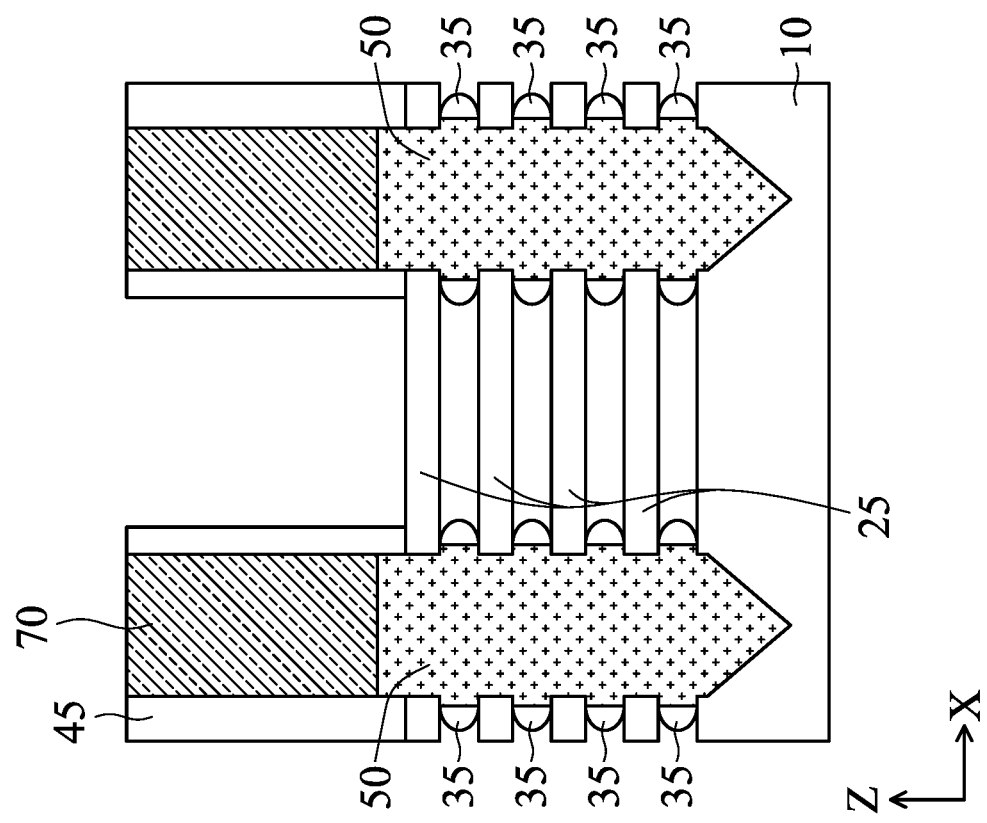

Similarly, the second semiconductor layers 25 are removed in the p-type region, thereby forming wires (channel regions) of the first semiconductor layers 20, as shown in FIG. 18B. The second semiconductor layers 25 can be removed or etched using an etchant that can selectively etch the second semiconductor layers 25 against the first semiconductor layers 20, as set forth above. As shown in FIG. 18B, since the second insulating layers (inner spacers) 65 are formed, the etching of the second semiconductor layers 25 stops at the second insulating layer 65. In other words, the second insulating layer 65 functions as an etch-stop layer for etching of the second semiconductor layers 25. The channel formation operations for the p-type region are performed, while the n-type region is covered by a protective layer. The formation of the channel regions for the p-type region can be performed after the formation of the channel regions for the n-type region.

Figure 19A:
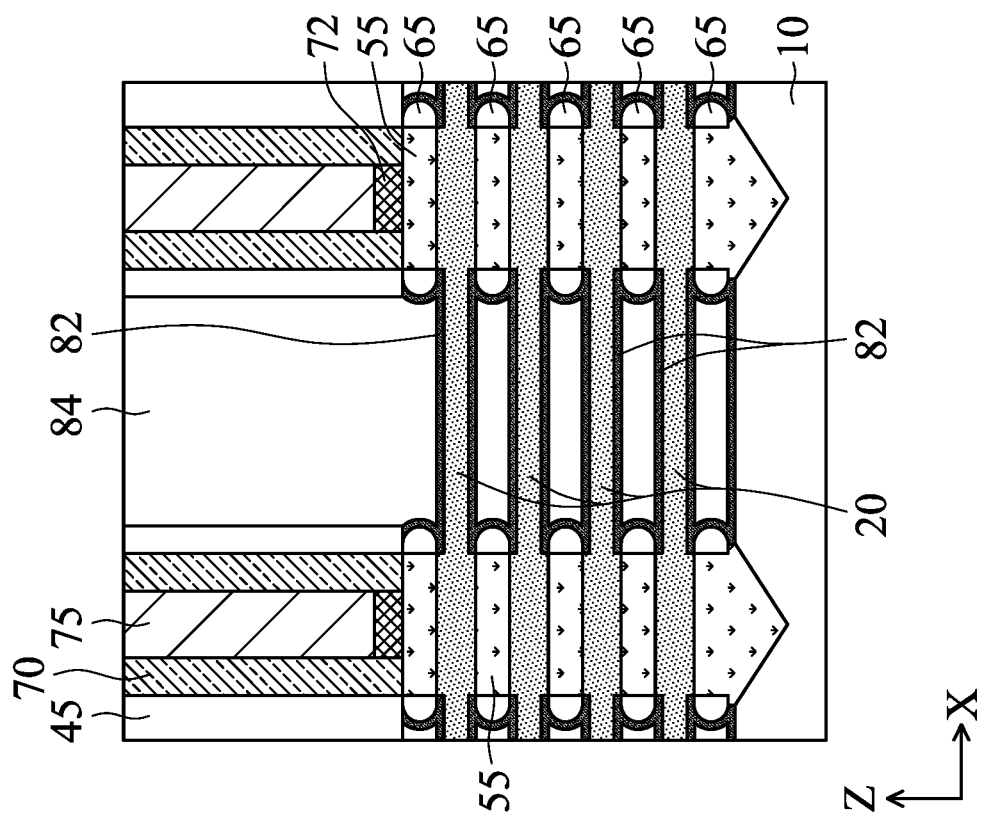
FIGS. 19A and 19B show one of the various stages of manufacturing a semiconductor GAA FET device according to an embodiment of the present disclosure.
Figure 19B:
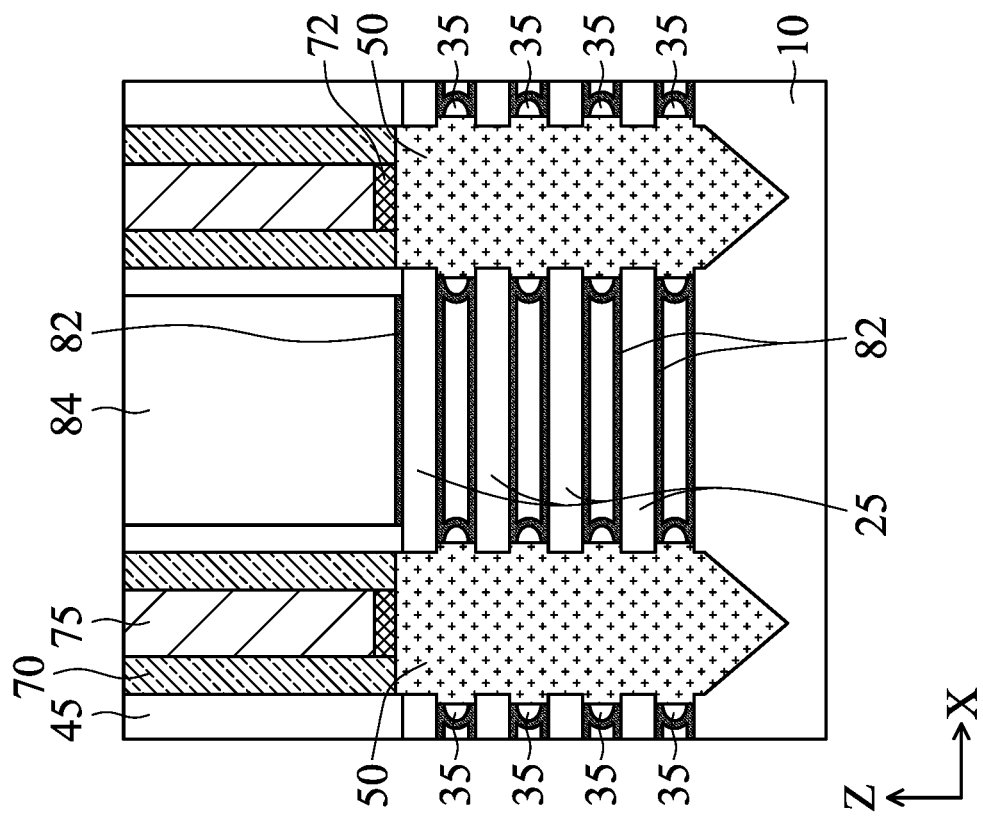

After the semiconductor wires (channel regions) of the second semiconductor layers 25 in the n-type region and the first semiconductor layers 20 in the p-type region are formed, a gate dielectric layer 82 is formed around each channel region for the n-type region and the p-type region. Further, a gate electrode layer 84 is formed on the gate dielectric layer 82, as shown in FIGS. 19A and 19B. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode 84. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 70 by using dry etching, thereby exposing the upper portion of the source/drain epitaxial layer 50. In some embodiments, a silicide layer is formed over the source/drain epitaxial layer 50. The silicide layer includes one or more of WSi, CoSi, NiSi, TiSi, MoSi and TaSi. Then, a conductive contact layer 72 is formed in the contact holes as shown in FIGS. 1A-1D. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN.

It is noted that in the foregoing embodiments, the order of the processes for the n-type GAA FET and the processes for the p-type GAA FET can be interchangeable. For example, in the foregoing embodiments, the inner spacers 35 for the n-type GAA FET are first formed and then the inner spacers 65 for the p-type GAA FET are formed. In other embodiments, the inner spacers 65 for the p-type GAA FET are first formed and then the inner spacers 35 for the n-type GAA FET are formed.

It is understood that the GAA FETs undergo further CMOS processes to form various features such as contacts/vias, interconnect metal layers, dielectric layers, passivation layers, etc.

In some embodiments, the inner spacers 35 for an n-type FET and the inner spacers 65 for a p-type FET are formed at the same time.

Figures 20A, 20B:
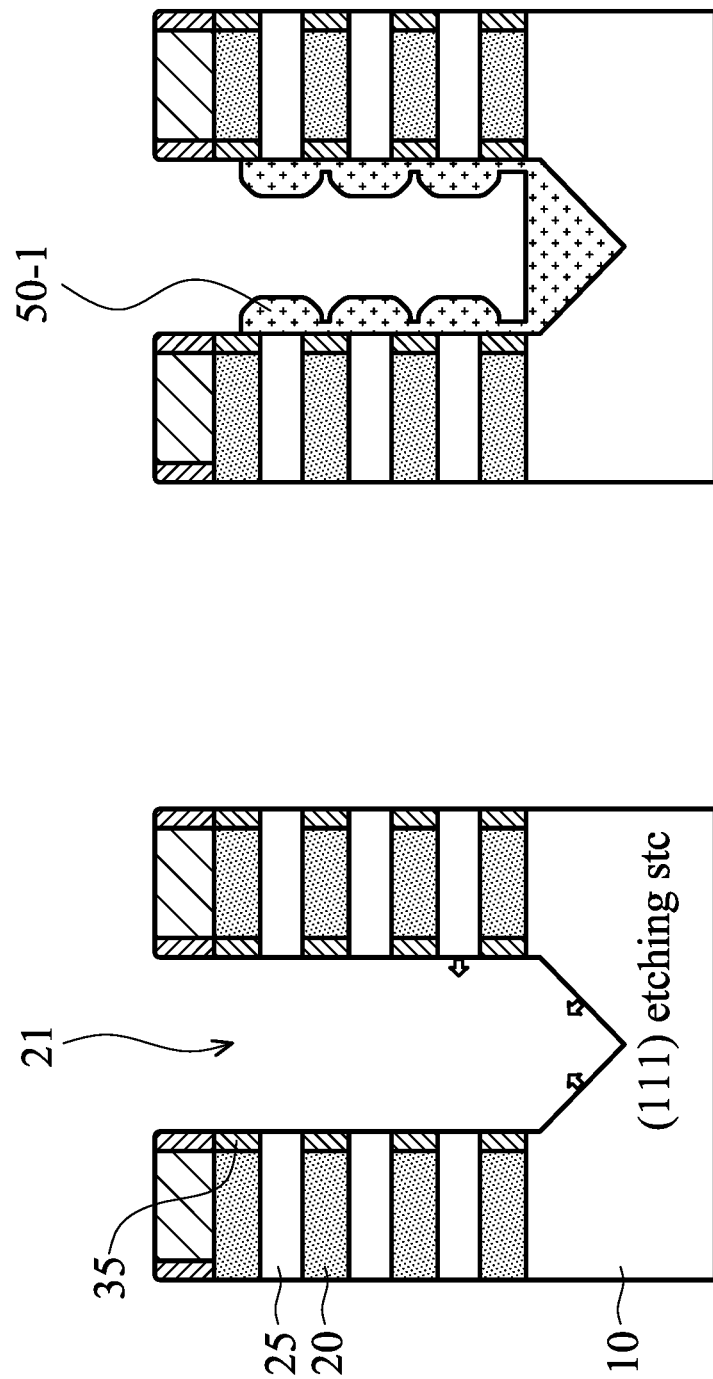
FIGS. 20A, 20B, 20C and 20D show various stages of forming source/drain epitaxial layers according to an embodiment of the present disclosure.

FIGS. 20A-20D show process steps for manufacturing a source/drain epitaxial layer 50 according to embodiments of the present disclosure. FIG. 20A show a cross sectional view after the source/drain space 21 is formed. After the source/drain space 21 is formed, a pre-clean operation is performed. In some embodiments, the pre-clean operation includes a plasma treatment using Ar and/or $NH_3$ plasma. The process temperature is in a range from about room temperature to about 300° C. in some embodiments. Then, a baking/annealing operation is performed to control the shape of the epitaxial layer subsequently formed. In some embodiments, the baking/annealing operation is performed in an $H_2$ ambient. The process temperature is higher than that of the pre-clean operation and is in a range from about 500° C. to about 700° C. in some embodiments.

FIG. 20B shows an initial stage of forming a first epitaxial layer 50-1 (L1). In some embodiments, the first epitaxial layer 50-1 is made of SiP, SiAs or SiAs:P or combination thereof. In some embodiments, the P concentration of the first epitaxial layer 50-1 is in a range from about $0.5 \times 10^{19}$ atoms/$cm^3$ to about $5 \times 10^{20}$ atoms/$cm^3$, and is in a range from about $0.8 \times 10^{19}$ atoms/$cm^3$ to about $2 \times 10^{20}$ atoms/$cm^3$ in other embodiments. The process temperature for forming the first epitaxial layer 50-1 is higher than that of the baking/annealing operation, and is in a range from about 700° C. to about 900° C. in some embodiments. Then, in-situ HCL etching is performed after the first epitaxial layer 50-1 is formed, in some embodiments.

Figure 20C:
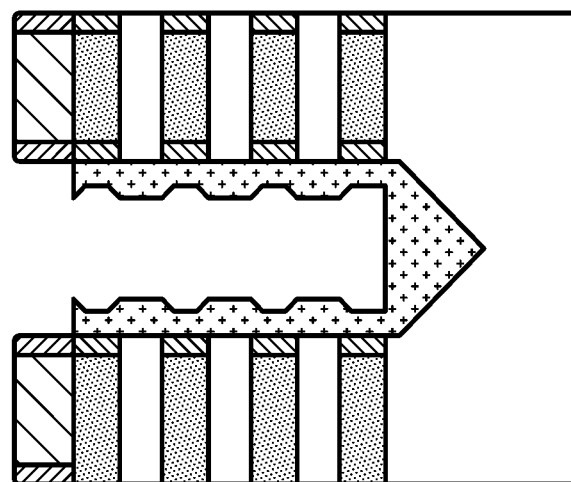

As shown in FIGS. 20B and 20C, the SiP layer of the first epitaxial layer grows from Si surfaces, e.g., ends of the second semiconductor layers 25 and the bottom of the V-shape recess. In some embodiments, the ends of the second semiconductor layers 25 are (110) faces. Since a growth rate on a (110) face is greater than that on and (111) surfaces, the SiP layer grown on the ends of the second semiconductor layers 25 merges each other first and then merges with the SiP layer grown from the V-shape recess. In particular, an inner spacer 35 at the bottommost second semiconductor layer 25 and the V-shape recess prevents the SiP layer grown on the ends of the second semiconductor layers 25 from merging with the SiP layer grown from the V-shape recess earlier in the epitaxial process. Subsequently, the first SiP epitaxial layer 50-1 covers the inner spacers 35 as shown in FIG. 20C. As shown in FIG. 20C, the first SiP epitaxial layer 50-1 has a larger thickness in the horizontal direction on the end of the second semiconductor layer 25 than on the inner spacer 35, because the epitaxial growth starts on the ends of the second semiconductor layers. In some embodiments, the difference in the thickness on the ends of the second semiconductor layers and on the inner spacers is in a range from about 1 nm to about 20 nm. In some embodiments, the growth of the first SiP epitaxial layer includes gases mixed of $SiH_4$ and HCl. The gas mixture simultaneously etches and deposit a semiconductor layer to control the shape of the first epitaxial layer 50-1. In some embodiments, the SiH$_4$ gas helps the growth of SiP on the (100) surface and the HCl gas etches the (110) surface after than the (111) surface. In other embodiments, the ends of the second semiconductor layers 25 are (100) faces and a growth rate on a (100) face is greater than that on (111) face.

After the first epitaxial layer 50-1 is formed, a cleaning operation is performed as in some embodiments. The cleaning operation includes a chemical dry cleaning (etching) using SiH$_4$ and HCl gases. The process temperature of the cleaning operation is lower than that of forming the first epitaxial layer 50-1 and higher that of the baking/annealing operation, and is in a range from about 650° C. to about 750° C. in some embodiments. In other embodiments, the process temperature of the cleaning operation is lower than that of the baking/annealing operation.

Figure 20D:
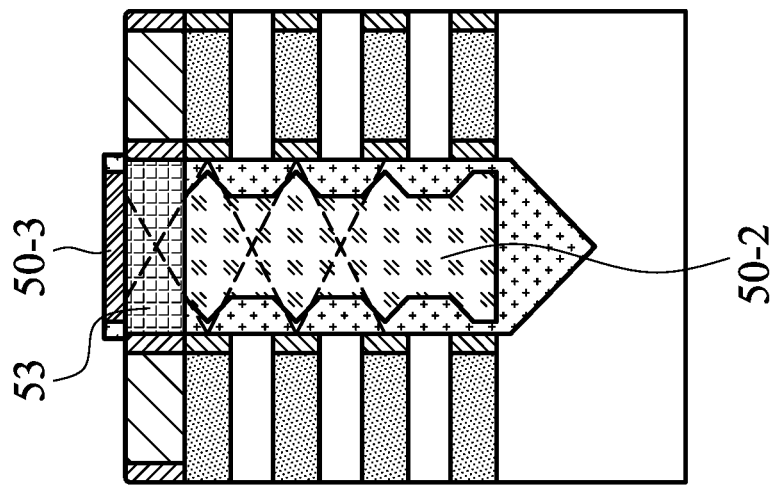

After the cleaning operation, a second epitaxial layer 50-2 (L2) is formed as shown in FIG. 20D. In some embodiments, the second epitaxial layer 50-2 is made of SiP. In some embodiments, the P concentration of the second epitaxial layer 50-2 is higher than that of the first SiP epitaxial layer 50-1, and is in a range from about $1 \times 10^{21}$ atoms/cm$^3$ to about $5 \times 10^{21}$ atoms/cm$^3$, and is in a range from about $2 \times 10^{21}$ atoms/cm$^3$ to about $4 \times 10^{21}$ atoms/cm$^3$ in other embodiments. The process temperature for forming the second epitaxial layer 50-2 is lower than that of the cleaning operation and that of forming the first epitaxial layer 50-1, and is in a range from about 600° C. to about 700° C. in some embodiments. As shown in FIG. 20D, the second epitaxial layer 50-2 fully fills the source/drain space 21.

In some embodiments, the first epitaxial layer 50-1 fully fills the V-shape recess and a bottom of the second epitaxial layer 50-2 is located above an upper surface of the fin structure 11. In other embodiments, the first epitaxial layer 50-1 partially fills the V-shape recess and the bottom of the second epitaxial layer 50-2 is located below the upper surface of the fin structure 11.

In some embodiments, during the growth of the second epitaxial layer 50-2, dislocations of crystal 53 are generated, which function as an embedded stressor. The dislocations can be observed by a transmission electron microscopy (TEM) as, for example, disorder of crystal structure. In some embodiments, the origins of the dislocation is located at the first epitaxial layer 50-1 formed on the inner spacers 35, due to growth rate differences among (100), (110) and (111) faces. In some embodiments, the stressor of the dislocations prevents phosphorus out-diffusion. In some embodiments, at least one of the dislocations 53 penetrates into the third epitaxial layer 50-3. In other embodiments, at least one of the dislocations 53 stops within the second epitaxial layer 50-2.

In some embodiments, after the second epitaxial layer 50-2 is formed, a cleaning operation is performed The cleaning operation includes a chemical dry cleaning (etching) using GeH$_4$ and HCl gases. The process temperature of the cleaning operation is lower than that of forming the first epitaxial layer 50-1 and higher that of forming the second epitaxial layer 50-2, and is in a range from about 650° C. to about 750° C. in some embodiments.

After the cleaning operation, a third epitaxial layer 50-3 (L3) as a cap epitaxial layer is formed as shown in FIG. 20D. In some embodiments, the third epitaxial layer 50-3 is made of SiGeP. In some embodiments, the P concentration of the third epitaxial layer 50-3 is equal to or lower than that of the second SiP epitaxial layer 50-2 and higher than that of the first SiP epitaxial layer, and is in a range from about $0.5 \times 10^{21}$ atoms/cm$^3$ to about $4 \times 10^{21}$ atoms/cm$^3$, and is in a range from about $1 \times 10^{21}$ atoms/cm$^3$ to about $3 \times 10^{21}$ atoms/cm$^3$ in other embodiments.

In some embodiments, the Ge concentration of the third epitaxial layer 50-3 is in a range from about 0.5 atomic % to 10 atomic %, and is in a range from about 1 atomic % to about 5 atomic % in other embodiments. The process temperature for forming the third epitaxial layer 50-2 is lower than that of the cleaning operation and equal to or lower that of forming the second epitaxial layer 50-2, and is in a range from about 600° C. to about 700° C. in some embodiments. As shown in FIG. 20D, the third epitaxial layer 50-3 is formed on the second epitaxial layer 50-2 and is not contact with the first epitaxial layer 50-1.

FIGS. 21A and 21B show vertical and lateral elemental profiles of the source/drain epitaxial layer. In some embodiments, the thickness of the first epitaxial layer 50-1 is in a range from about 3 nm to about 10 nm. As shown in FIG. 21B, the Si concentration of the second SiP epitaxial layer 50-2 is smaller than that of the first SiP epitaxial layer 50-1 in some embodiments.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, an upper fin structure in which first semiconductor layers and second semiconductor layers are alternately stacked is formed over a lower fin structure, a sacrificial gate structure is formed over the upper fin structure, a source/drain region of the upper fin structure, which is not covered by the sacrificial gate structure, is etched thereby forming a source/drain space, the first semiconductor layers are laterally etched through the source/drain space, an inner spacer made of a dielectric material is formed on an end of each of the etched first semiconductor layers, and a source/drain epitaxial layer is formed in the source/drain space to cover the inner spacer. In etching the source/drain region, a part of the lower fin structure is also etched to form a recess, in which a (111) surface is exposed. In one or more of the foregoing and following embodiments, the recess has a V-shape or a triangular shape in cross section. In one or more of the foregoing and following embodiments, the source/drain epitaxial layer includes a first epitaxial layer in contact with ends of the second semiconductor layers and the inner spacer, and a second epitaxial layer formed on the first epitaxial layer. In one or more of the foregoing and following embodiments, the source/drain epitaxial layer further includes a third epitaxial layer on the second epitaxial layer and not in contact with the first epitaxial layer. In one or more of the foregoing and following embodiments, the first epitaxial layer includes SiP and the second epitaxial layer includes SiP having a higher P concentration than the first epitaxial layer. In one or more of the foregoing and following embodiments, the third epitaxial layer includes SiGeP. In one or more of the foregoing and following embodiments, the inner spacer is formed by forming a dielectric layer in the source/drain space, and etching the dielectric layer, thereby leaving the inner spacer on the end of each of the etched first semiconductor layers remaining. In one or more of the foregoing and following embodiments, before the first semiconductors are laterally etched, sidewall spacers are formed on side faces of the sacrificial gate structure, and the sidewall spacers are made of a different material than the inner spacer. In one or more of the foregoing and following embodiments, the inner spacers include at least one of silicon nitride and silicon oxide. In one or more of the foregoing and following embodiments, the inner spacers include at least one of SiOC, SiOCN and SiCN.

In accordance with another aspect of the present disclosure, in a method of manufacturing a semiconductor device, an upper fin structure in which first semiconductor layers and second semiconductor layers are alternately stacked is formed over a lower fin structure, a sacrificial gate structure is formed over the upper fin structure, a source/drain region of the upper fin structure, which is not covered by the sacrificial gate structure, is etched thereby forming a source/drain space having a V-shape bottom, the first semiconductor layers are laterally etched through the source/drain space, an inner spacer made of a dielectric material is formed on an end of each of the etched first semiconductor layers, and a source/drain epitaxial layer is formed in the source/drain space to cover the inner spacer. In the forming the source/drain epitaxial layer, a first epitaxial layer is formed, and a second epitaxial layer is formed on the first epitaxial layer. A thickness in a horizontal direction of the first epitaxial layer on ends of the second semiconductor layers is greater than a thickness in the horizontal direction of the first epitaxial layer on the inner spacer. In one or more of the foregoing and following embodiments, in the V-shape bottom, a (111) surface is exposed. In one or more of the foregoing and following embodiments, the source/drain epitaxial layer includes a dislocation starting from the inner spacer. In one or more of the foregoing and following embodiments, in the etching a source/drain region of the upper fin structure, the first and second semiconductor layers of the source/drain region of the upper fin structure are etched. In one or more of the foregoing and following embodiments, in the etching a source/drain region of the upper fin structure, the first semiconductor layers of the source/drain region of the upper fin structure are selectively etched, thereby leaving the second semiconductor layers remaining. In one or more of the foregoing and following embodiments, after the source/drain epitaxial layer is formed, the sacrificial gate structure is removed, thereby exposing a part of the fin structure, the first semiconductor layers are removed from the exposed fin structure, thereby forming channel layers including the second semiconductor layers, and a gate dielectric layer and a gate electrode layer are formed around the channel layers. The gate electrode layer is isolated from the source/drain epitaxial layer by the inner spacer and the gate dielectric layer.

In accordance with another aspect of the present disclosure, in a method of manufacturing a semiconductor device, an upper fin structure in which first semiconductor layers and second semiconductor layers are alternately stacked is formed over a lower fin structure, a sacrificial gate structure is formed over the upper fin structure, a source/drain region of the upper fin structure, which is not covered by the sacrificial gate structure, is etched thereby forming a source/drain space, the first semiconductor layers are laterally etched through the source/drain space, an inner spacer made of a dielectric material is formed on an end of each of the etched first semiconductor layers, and a source/drain epitaxial layer is formed in the source/drain space to cover the inner spacer. In the forming the source/drain epitaxial layer, a hydrogen treatment is performed, a first epitaxial layer is formed, a first cleaning operation is performed, a second epitaxial layer is formed on the first epitaxial layer, and a second cleaning operation is performed. A process temperature of the forming the first epitaxial layer is higher than a process temperature of the hydrogen treatment, and a process temperature of the forming the second epitaxial layer is lower than the process temperature of the forming the first epitaxial layer. In one or more of the foregoing and following embodiments, the first cleaning operation comprises a treatment using silicon containing gas and HCl gas. In one or more of the foregoing and following embodiments, the second cleaning operation comprises a treatment using germanium containing gas and HCl gas. In one or more of the foregoing and following embodiments, the process temperature of the forming the second epitaxial layer is lower than a process temperature of the first cleaning operation.

In accordance with another aspect of the present disclosure, a semiconductor device includes semiconductor wires or sheets disposed over a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each channel region, and insulating spacers disposed in spaces, respectively, the spaces being defined by adjacent semiconductor wires or sheets, the gate electrode layer and the source/drain region. The source/drain epitaxial layer includes dislocations. In one or more of the foregoing and following embodiments, the source/drain epitaxial layer includes a first epitaxial layer in contact with ends of the second semiconductor layers and the inner spacer, and a second epitaxial layer formed on the first epitaxial layer, and the dislocations start in the first epitaxial layer on the inner spacers. In one or more of the foregoing and following embodiments, the source/drain epitaxial layer includes a third epitaxial layer on the second epitaxial layer and not in contact with the first epitaxial layer. In one or more of the foregoing and following embodiments, the first epitaxial layer includes SiP, the second epitaxial layer includes SiP having a higher P concentration than the first epitaxial layer, and the third epitaxial layer includes SiGeP. In one or more of the foregoing and following embodiments, the third epitaxial layer is not in contact with the first epitaxial layer. In one or more of the foregoing and following embodiments, the semiconductor device further includes sidewall spacers disposed on side faces of the gate electrode, and the sidewall spacers are made of a different material than the inner spacers. In one or more of the foregoing and following embodiments, the inner spacers include at least one of silicon nitride and silicon oxide. In one or more of the foregoing and following embodiments, the inner spacers include at least one of SiOC, SiOCN and SiCN.

In accordance with another aspect of the present disclosure, a semiconductor device includes semiconductor wires or sheets disposed over a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each channel region, and insulating spacers disposed in spaces, respectively, the spaces being defined by adjacent semiconductor wires or sheets, the gate electrode layer and the source/drain region. The source/drain epitaxial layer includes a first epitaxial layer in contact with ends of the second semiconductor layers and the inner spacer, and a second epitaxial layer formed on the first epitaxial layer, and a thickness in a horizontal direction of the first epitaxial layer on the ends of the second semiconductor layers is greater than a thickness in the horizontal direction of the first epitaxial layer on the inner spacers. In one or more of the foregoing and following embodiments, the semiconductor wires or sheets are disposed over a bottom fin structure, the bottom fin structure includes a recess, and the first epitaxial layer fills the recess. In one or more of the foregoing and following embodiments, the recess has a V-shape in which a (111) surface of the bottom fin structure is in contact with the first epitaxial layer. In one or more of the foregoing and following embodiments, the first epitaxial layer fully fills the recess and a bottom of the second epitaxial layer is located above an upper surface of the bottom fin structure. In one or more of the foregoing and following embodiments, the semiconductor wires or sheets made of Si. In one or more of the foregoing and following embodiments, the source/drain epitaxial layer includes dislocations starting from the inner spacers. In one or more of the foregoing and following embodiments, the source/drain epitaxial layer includes a third epitaxial layer on the second epitaxial layer. In one or more of the foregoing and following embodiments, at least one of the dislocations penetrates into the third epitaxial layer.

In accordance with another aspect of the present disclosure, a semiconductor device includes semiconductor wires or sheets disposed over a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each channel region, and insulating spacers disposed in spaces, respectively, the spaces being defined by adjacent semiconductor wires or sheets, the gate electrode layer and the source/drain region. The source/drain epitaxial layer includes a first epitaxial layer, a second epitaxial layer over the first epitaxial layer and a third epitaxial layer over the second epitaxial layer, and includes a dislocation starting from the first epitaxial layer, passing through the second epitaxial layer and penetrating into the third epitaxial layer. In one or more of the foregoing and following embodiments, the third epitaxial layer is not in contact with the first epitaxial layer. In one or more of the foregoing and following embodiments, the dislocation starts from one of the inner spacers. In one or more of the foregoing and following embodiments, a thickness in a horizontal direction of the first epitaxial layer on the ends of the second semiconductor layers is greater than a thickness in the horizontal direction of the first epitaxial layer on the inner spacers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming an upper fin structure in which first semiconductor layers and second semiconductor layers are alternately stacked over a lower fin structure;
    forming a sacrificial gate structure over the upper fin structure;
    etching a source/drain region of the upper fin structure, which is not covered by the sacrificial gate structure, thereby forming a source/drain space;
    laterally etching the first semiconductor layers through the source/drain space;
    forming an inner spacer made of a dielectric material on an end of each of the etched first semiconductor layers; and
    forming a source/drain epitaxial layer in the source/drain space to cover the inner spacer,
    wherein in etching the source/drain region, a part of the lower fin structure is also etched to form a recess, in which a (111) surface is exposed, and
    the forming the source/drain epitaxial layer includes forming a first epitaxial layer in contact with a bottom of the recess to fill the recess and in contact with ends of the second semiconductor layers and the inner spacer.

2. The method of claim 1, wherein the recess has a V-shape or a triangular shape in cross section.

3. The method of claim 1, wherein the forming the source/drain epitaxial layer includes forming a second epitaxial layer formed on the first epitaxial layer.

4. The method of claim 3, wherein the forming the source/drain epitaxial layer further includes forming a third epitaxial layer on the second epitaxial layer such that the third epitaxial layer is not in contact with the first epitaxial layer.

5. The method of claim 3, wherein the first epitaxial layer includes SiP and the second epitaxial layer includes SiP having a higher P concentration than the first epitaxial layer.

6. The method of claim 5, wherein the third epitaxial layer includes SiGeP.

7. The method of claim 3, wherein the first epitaxial layer includes one or more selected from the group consisting of SiP, SiAs and SiP:As where an As concentration is higher than a P concentration.

8. The method of claim 1, wherein an end of each of the second semiconductor layers is a (110) surface.

9. The method of claim 1, wherein a thickness in a horizontal direction of the first epitaxial layer on ends of the second semiconductor layers is greater than a thickness in the horizontal direction of the first epitaxial layer on the inner spacer.

10. The method of claim 1, wherein the inner spacers include at least one of silicon nitride, silicon oxide, SiOC, SiOCN and SiCN.

11. A method of manufacturing a semiconductor device, comprising:
    forming an upper fin structure in which first semiconductor layers and second semiconductor layers are alternately stacked over a lower fin structure;
    forming a sacrificial gate structure over the upper fin structure;
    etching a source/drain region of the upper fin structure, which is not covered by the sacrificial gate structure, thereby forming a source/drain space having a V-shape bottom;
    laterally etching the first semiconductor layers through the source/drain space;
    forming an inner spacer made of a dielectric material on an end of each of the etched first semiconductor layers; and
    forming a source/drain epitaxial layer in the source/drain space to cover the inner spacer, wherein:
    the forming the source/drain epitaxial layer comprises:
        forming a first epitaxial layer in contact with a bottom of the source/drain space to fill the source/drain space and over the inner spacer; and forming a second epitaxial layer on the first epitaxial layer, and a thickness in the horizontal direction of the first epitaxial layer on ends of the second semiconductor layers is greater than a thickness in the horizontal direction of the first epitaxial layer on the inner spacer.

12. The method of claim 11, wherein in the V-shape bottom, a (111) surface is exposed.

13. The method of claim 11, wherein the source/drain epitaxial layer includes a dislocation starting from the inner spacer.

14. The method of claim 11, wherein in the etching a source/drain region of the upper fin structure, the first and second semiconductor layers of the source/drain region of the upper fin structure are etched.

15. The method of claim 11, wherein in the etching a source/drain region of the upper fin structure, the first semiconductor layers of the source/drain region of the upper fin structure are selectively etched, thereby leaving the second semiconductor layers remaining.

16. The method of claim 11, further comprising, after the source/drain epitaxial layer is formed:
removing the sacrificial gate structure, thereby exposing a part of the upper fin structure;
removing the first semiconductor layers from the exposed fin structure, thereby forming channel layers including the second semiconductor layers; and
forming a gate dielectric layer and a gate electrode layer around the channel layers,
wherein the gate electrode layer is isolated from the source/drain epitaxial layer by the inner spacer and the gate dielectric layer.

17. A semiconductor device, comprising:
semiconductor wires or sheets disposed over a bottom fin structure disposed over a substrate;
a source/drain epitaxial layer in contact with the semiconductor wires or sheets;
a gate dielectric layer disposed on and wrapping around each channel region of the semiconductor wires or sheets;
a gate electrode layer disposed on the gate dielectric layer and wrapping around each channel region; and
insulating spacers disposed in spaces, respectively, the spaces being defined by adjacent semiconductor wires or sheets, the gate electrode layer and the source/drain epitaxial layer, wherein:
the bottom fin structure includes a recess, and
the source/drain epitaxial layer includes a first epitaxial layer continuously disposed in contact with a bottom of the recess and to fill the recess, ends of the second semiconductor layers and the insulating spacers.

18. The semiconductor device of claim 17, wherein:
the source/drain epitaxial layer includes a second epitaxial layer formed on the first epitaxial layer, and
the source/drain epitaxial layer includes dislocations of crystal and the dislocations start in the first epitaxial layer on the inner insulating spacers.

19. The semiconductor device of claim 18, wherein the source/drain epitaxial layer includes a third epitaxial layer on the second epitaxial layer.

20. The semiconductor device of claim 19, wherein:
the first epitaxial layer includes one or more of SiP, SiAs or SiP:As where an As concentration is higher than a P concentration,
the second epitaxial layer includes SiP having a higher P concentration than the first epitaxial layer, and
the third epitaxial layer includes SiGeP.

* * * * *